United States Patent
Brelet (12)

(10) Patent No.: US 6,353,332 B1
(45) Date of Patent: Mar. 5, 2002

(54) METHODS FOR IMPLEMENTING CAM FUNCTIONS USING DUAL-PORT RAM

(75) Inventor: Jean-Louis Brelet, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/499,498

(22) Filed: Feb. 7, 2000

(51) Int. Cl.[7] .................................................. G06F 7/38
(52) U.S. Cl. ............................ 326/40; 716/16; 716/17; 365/49
(58) Field of Search ........................ 326/39, 40; 716/16, 716/17; 365/49, 230.05; 711/108

(56) References Cited

U.S. PATENT DOCUMENTS

| | | | |
|---|---|---|---|
| 6,114,873 A | * 9/2000 | Sahraoui et al. | 326/39 |
| 6,157,557 A | * 12/2000 | Lee et al. | 365/49 |
| 6,263,400 B1 | * 7/2001 | Rangasayee et al. | 365/49 X |
| 6,278,289 B1 | * 8/2001 | Guccione et al. | 326/40 |

OTHER PUBLICATIONS

Xilinx Application Note by Jean–Louis Brelet, "Using Block SelectRam+ for High–Performance Read/Write CAMs", XAPP204 (Version 1.1) Oct. 1, 1999, pp. 1–22.
Jean–Louis Brelet, Xilinx, Inc., "Parallel processing in FPGA applicable to Content Addressable Memories", 2000 System–on–Chip Design Conference, Slide #'s 1–44.

Xilinx, Inc., "The Programmable Logic Data Book", 1999, available from Xilinx, Inc., 2100 Logic Drive, San Jose, CA 95124, pp. 3–1 to 3–60.

* cited by examiner

Primary Examiner—David L. Robertson
(74) Attorney, Agent, or Firm—Patrick T. Bever

(57) ABSTRACT

A method for implementing a CAM function using a dual-port RAM. Data is stored in the memory array of the dual-port RAM as decoded "one hot" data words such that each data word is stored in one column, and each data word includes only one logic "1" bit value. Data match operations are then performed by reading a row of memory cells of the memory array in response to a match data word. If the row contains one or more of the logic "1" bit values, then the match data word matches (is equal to) one or more of the decoded "one hot" data words. One input port of the dual-port RAM is configured to automatically write decoded "one hot" data words into the memory array by accessing a selected memory cell in response to an X+Y-bit word. The encoded X+Y-bit word is transmitted to an address terminal of the first input port, and a logic "1" bit value is transmitted to a data input terminal of the first data port. A Y-bit (write address) portion of X+Y-bit word is decoded by the column decoder of the dual-port RAM, thereby accessing the column in which the selected memory cell is located. An X-bit (write data) portion of X+Y-bit word is decoded by the row decoder of the dual-port RAM, thereby accessing the row in which the selected memory cell is located. The logic "1" bit value applied to the data input terminal of the first input port is then written into the selected memory cell.

20 Claims, 10 Drawing Sheets

| BIT POSITION | 0 | 1 | 2 | 3 | 4 | 5 | 6 | 7 |
|---|---|---|---|---|---|---|---|---|
| MEMORY CELL | M3 | M7 | M11 | M15 | M19 | M23 | M27 | M31 |
| DECODED WORD | 0 | 0 | 0 | 0 | 0 | 1 | 0 | 0 |

350

METHODS FOR IMPLEMENTING CAM FUNCTIONS USING DUAL-PORT RAM

FIELD OF THE INVENTION

The invention relates to Content Addressable Memory (CAM) circuits. The invention particularly relates to methods for implementing CAM functions using dual-port Random Access Memory (RAM) circuits.

BACKGROUND OF THE INVENTION

RAM circuits are well-known data storage devices that store data values in an array of addressed memory locations. To determine whether a particular data value is stored in a RAM, an address-based data searching method is performed in which data values are sequentially read out from the RAM and compared with the particular data value. Specifically, a series of addresses are transmitted to an address port of the RAM, thereby causing data values to be read out from the memory locations associated with the addresses and transmitted to an output port of the RAM. A separate comparator circuit is then used to compare each of the output data values with the searched-for data value, and to generate a signal when a match occurs. When a large number of data values is searched, such address-based search operations are very time consuming because only one data value is searched/compared each clock cycle.

CAM circuits are a second type of data storage device in which a data value is searched for by its content, rather than by its address. Data values are stored (pre-loaded) in CAM circuits such that each data value is assigned to a row or column of an array of CAM cells. To determine whether a particular data value is stored in the CAM circuit, a content-based data match operation is performed in which the searched-for data value is simultaneously compared with the rows/columns containing the pre-loaded data values. When one or more of the pre-loaded data value matches the searched-for data value, a "match" signal is generated by the CAM circuit, along with an address indicating the storage location (i.e., row or column) of the pre-loaded data value. By simultaneously comparing the searched-for data value with several pre-loaded data values, a CAM circuit is able to perform compare-and-match (hereafter "match") operations involving several pre-loaded data values in a single clock cycle. Therefore, when compared with RAM circuits, CAM circuits significantly reduce the search time needed to locate a particular data value from a large number of data values.

PLDs are integrated circuits that typically include user-configurable circuitry that is controlled by configuration data to implement a user's logic function. The user-configurable circuitry typically includes general-purpose logic resources (e.g., look-up tables), special-purpose logic resources (e.g., RAM circuits), and interconnect resources that are connected between the general-purpose and special purpose logic resources. To program a PLD, a user typically enters a desired logic function into a Personal Computer (PC) or workstation that is configured to run one or more place-and-route software programs. These place-and-route software programs then generate a configuration solution by assigning portions of the logic function to specific logic resources of the PLD, and allocating sections of the interconnect resources to form signal paths between the logic resources, thereby causing the PLD to emulate the desired logic function. The configuration solution generated by the place-and-route software is then converted into a bitstream that is transmitted into the configuration memory of the PLD.

Early PLDs could not support on-chip CAM functions, and external dedicated CAM circuits were required. These dedicated CAM circuits were connected to the input/output (I/O) terminals of the PLDs, and CAM functions were performed in conjunction with PLD operations by transmitting information between the PLD and the dedicated CAM circuit. A problem with this arrangement is that it results in relatively slow operation speeds, and requires the use of precious PLD I/O resources that typically limits the complexity of other logic functions implemented in the PLD. Therefore, there is a demand for PLDs that perform on-chip CAM functions in order to speed up CAM operations and free-up PLD I/O resources.

More recently, advanced PLDs have been produced with dedicated CAM circuits that provide on-chip PLD CAM functions. For example, APEX™ 20KE devices, produced by Altera® Corporation, include special-purpose CAM circuits in addition to general-purpose logic resources and other special-purpose logic resources (e.g., RAM circuits).

A problem with including dedicated CAM circuitry on PLDs is that the CAM circuitry is essentially useless unless a user's logic function implements a CAM function. That is, unlike general-purpose logic circuitry, dedicated conventional CAM circuitry typically cannot be used for non-CAM logic functions. Therefore, the dedicated CAM circuitry remains idle when a user's logic function does not include a CAM function, and takes up die space on the PLD that could otherwise be used for logic operations.

Another problem with including dedicated CAM circuitry on PLDs is the conflict between the amount of die space required for the CAM circuitry and the range of CAM functions that can be implemented by the CAM circuitry (i.e., the flexibility of the CAM circuitry). A relatively simple CAM circuit requires relatively little die space, but is less likely to support a wide range of CAM functions (i.e., has little flexibility). On the other hand, a sophisticated CAM circuit is more likely to support a wide range of CAM functions, but requires a large amount of die space, thereby reducing the number of general-purpose logic resources provided on the PLD. Therefore, a PLD manufacturer must balance the flexibility of the CAM circuit with the amount of die space occupied by the CAM circuitry. Typically, such choices result in CAM features that are less than optimal. For example, the dedicated CAM circuitry provided in APEX™ 20KE devices only supports single clock cycle CAM operations to data words having widths of 32-bits or less.

What is needed is a method of implementing CAM functions without requiring dedicated, special-purpose CAM circuitry, thereby overcoming the problems described above.

SUMMARY OF THE INVENTION

The present invention provides methods for implementing a CAM function in one or more dual-port RAM circuits (referred to herein as "dual-port RAMs"). In effect, the present invention extends the range of functions that can be implemented by a dual-port RAM to include CAM functions. The methods are particularly useful when implemented in PLDs because they eliminate the need for dedicated CAM circuitry that is provided in some PLDS, thereby freeing more IC area for general purpose logic circuitry. Further, the methods described herein can be applied to multiple dual-port RAMs, thereby providing very wide and deep CAM functions that can be performed in a single clock cycle. Also provided is a PLD including a dual-port RAM that is configured in accordance with the present invention to implement CAM functions.

Dual-port RAMs, which are utilized to perform the methods of the present invention, typically include an array of memory cells arranged in rows and columns, and first and second input ports that independently access the memory array through a row decoder and a column decoder (which can be functionally combined to form a single decoder). In one embodiment, the first input port is used during CAM write and erase operations, and the second input port is used during CAM data match operations.

According to a first main aspect of the present invention, a dual-port RAM is utilized to implement CAM functions by storing decoded "one hot" data words in the columns of the RAM memory array, and then performing data match operations by reading selected rows of the RAM memory array. As used herein, each decoded "one hot" data word includes only one logic "1" bit (all other bits are logic "0"), and the decimal value of each decoded "one hot" data word is defined by the bit position of the logic "1" bit. For example, an eight-bit decoded "one hot" data word can have a decimal value between "0" (i.e., 00000001) and "7" (i.e., 10000000), depending upon the position of the logic "1" bit. In one embodiment, each decoded "one hot" data word is stored in one column of the RAM memory array. Accordingly, a group of decoded "one hot" data words can be simultaneously compared with a match data word by transmitting the encoded match data word to the RAM row decoder, and reading a selected row of memory cells that corresponds to the decoded match data word. A match is detected when one or more of the memory cells in the corresponding row includes at least one logic "1" bit value.

In accordance with a second main aspect of the present invention, the first input port of the dual-port RAM is configured to automatically write (or erase) decoded "one hot" data words into (or from) the memory array by accessing a selected memory cell in response to an X+Y-bit word. The encoded X+Y-bit word is transmitted to an address terminal of the first input port, and a logic bit value (i.e., logic "1" during write operations, and logic "0" during read operations) is transmitted to a data input terminal of the first data port. A Y-bit (write address) portion of the X+Y-bit word is decoded by the column decoder of the dual-port RAM, thereby accessing the column in which the selected memory cell is located. An X-bit (write data) portion of X+Y-bit word is decoded by the row decoder of the dual-port RAM, thereby accessing the row in which the selected memory cell is located. Stated differently, as accessed through the first input port, the memory array is a single "column" (or "row") of memory cells, and a selected memory cell is accessed by applying the X+Y-bit word to a "row" (or "column") decoder of the dual-port RAM. During write operations, a logic "1" bit value applied to the data input terminal of the first input port is then written into the selected memory cell. Because each decoded "one hot" data word includes only one logic "1" bit value, write operations are performed during a single clock cycle (assuming a memory array initialized to all logic "0"). During erase operations, a logic "1" bit value stored in the selected memory cell is overwritten by a logic "0" bit value applied to the data input terminal of the first input port. Again, because each decoded "one hot" data word includes only one logic "1" bit value, write operations are performed in a single clock cycle.

According to yet another aspect of the present invention, the second input port of the dual-port RAM is configured to read bit values stored in the memory cells of one row of the memory array in response to an X-bit encoded match data word that is applied during data match operations. The X-bit match data word is decoded by the row decoder to access a corresponding row of the memory array. Each decoded "one hot" data word is stored in one memory array column of the dual-port RAM, and the decimal value of each decoded "one hot" word is determined by the row in which the logic "1" is stored. For example, a dual-port RAM having a 16×256 memory array (e.g., sixteen columns and 256 rows) can store up to sixteen decoded "one hot" data words that have decimal values of 0 to 255. A match data word can be compared with all sixteen decoded "one hot" data words simultaneously by applying the match word to the row decoder of the dual-port RAM, and reading the corresponding row that is addressed by the row decoder. In other words, if a logic "1" appears in any of the sixteen bits read from the corresponding row of the memory array, then one of the decoded "one hot" data words matches the match data word. The address of the decoded "one hot" data word is determined by the bit position of the logic "1" bit value in the output word (i.e., which identifies the column storing the matching "one hot" data word). Multiple matches are identified when more than one logic "1" bit value appears in the output word.

The present invention is particularly useful when implemented in Programmable Logic Devices (PLDs) because it allows a PLD to support CAM functions without the need for dedicated CAM circuitry, thereby providing additional die space for general-purpose logic resources on the PLD.

In a first disclosed example, a PLD is configured to include an encoded data memory for storing encoded data values that are used to write decoded "one hot" data words in the memory array of a dual-port RAM in accordance with the methods described above. During subsequent erase operations, the encoded data words stored in encoded data memory are read out and used to erase the decoded "one hot" data words from the memory array. By storing these encoded data words in this manner, all decoded "one hot" data words can be erased from the dual-port RAM in a minimum number of clock cycles.

In a second disclosed example, a PLD is configured to illustrate the expandable depth of CAM functions performed in accordance with the present invention. The PLD resources are configured to connect four dual-port RAMs in parallel. An special address decoder is used to enable one of the four dual-port RAMs during write and erase operations, thereby allowing different data values to be written into each of the four dual-port RAMs. During data match operations, a match data word is simultaneously applied to all four dual-port RAMs, thereby simultaneously comparing the match data word to the decoded "one hot" data words stored in all four dual-port RAMs. The resulting output words transmitted from each dual-port RAM are combined to form a wide output word. Therefore, the second example illustrates how a PLD can be configured to perform CAM functions in which any number of decoded "one hot" data words are compared simultaneously to the match data word such that the output word provides the address of any one of the decoded "one hot" data words that matches the match data word. In contrast, PLDs that include a dedicated CAM circuit are limited by the output structure of the CAM circuit.

In a third disclosed example, a PLD is configured to illustrate the expandable width of CAM functions performed in accordance with the present invention. The PLD resources are configured to connect two dual-port RAMs such that each dual-port RAM stores one-half of a data word. During write operations, the bits of each encoded write data word are separated into two groups that are respectively used to store decoded "one hot" data words in the two dual-port RAMs. During data match operations, a match data word is similarly separated and compared with the decoded "one hot" data words stored in the two dual-port RAMs. Each bit of the output word generated by the first dual-port RAM is then ANDed with a corresponding bit of the output word generated by the second dual-port RAM. A match is detected when both corresponding bits are logic "1", and the address of the corresponding data word is indicated by a logic high output signal from a corresponding AND gate. Accordingly, the third example illustrates how a PLD can be configured to perform CAM functions supporting data words having any width. In contrast, PLDs that include dedicated CAM circuits are limited during single clock cycle match operations by the maximum width supported by the CAM circuit.

DETAILED DESCRIPTION OF THE DRAWINGS

The present invention is directed to methods for implementing a CAM function using a dual-port RAM. A first main aspect of the present invention is the storage of data as decoded "one hot" data words in the memory array of a dual-port RAM that allows CAM data match operations to be performed simply by reading data from the dual-port RAM. A second main aspect of the present invention involves a configuration scheme in which an input port of the dual-port RAM is configured to automatically convert encoded data into decoded "one hot" data words. While the configuration scheme of the second main aspect is important for facilitating practical CAM functions using a dual-port RAM, decoded "one hot" data words can be stored in the memory array using circuitry other than an input port of the dual-port RAM (e.g., through the configuration circuitry of a PLD). Therefore, while the first and second main aspects are related, it is possible to implement CAM functions in accordance with the present invention without utilizing the configuration scheme of the second main aspect.

Dual-Port RAM: Overview

Figure 1:
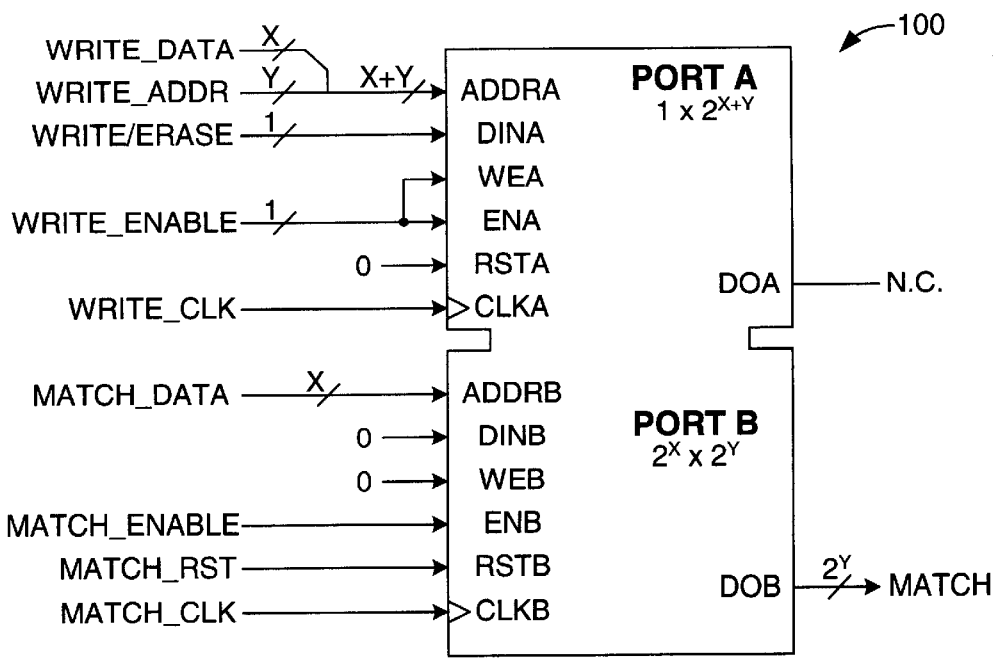
FIG. 1 is a block diagram showing a dual-port RAM configured in accordance with an embodiment of the present invention.

FIG. 1 is a block diagram illustrating a dual-port RAM 100 that is configured to implement binary CAM functions in accordance with the present invention.

Dual-port RAM 100 includes two ports (PORT A and PORT B), an array of memory cells (not shown), and one or more output ports (e.g., DOA and DOB). For purposes of explaining the present invention, it is assumed that the memory array includes $2^{X+Y}$ memory cells arranged in rows and columns (X and Y are integers). In accordance with the second main aspect of the present invention, a first port (e.g., PORT A) is utilized for writing data values into and erasing data values from the memory cells of dual-port RAM 100, and a second port (e.g., PORT B) is utilized for performing data match operations. Like most dual-port RAMs, PORT A and PORT B include input terminals for independently accessing the $2^{x+y}$ memory cells of dual-port RAM 100. In particular, each port includes address terminals, data input terminals, enable terminals, reset terminals, and clock terminals. The use of these terminals during write, erase and data match operations is discussed in the following paragraphs.

Referring to the upper portion of dual-port RAM 100, the terminals of PORT A are configured for write and erase operations as follows. Address terminal ADDRA of PORT A is configured to receive an X+Y-bit encoded word that is made up of an X-bit portion (referred to in FIG. 1 as the WRITE_DATA word) and a Y-bit portion (WRITE_ADDR word). As discussed below, the Y-bit portion is used to access a selected column and the X-bit portion is used to access a selected row during write and erase operations. A data input (DINA) terminal receives an externally-generated WRITE/ERASE data bit that has a logic "1" (high) bit value during write operations, and has a logic "0" (low) bit value during erase operations. The WRITE/ERASE data bit is stored in a selected memory cell located at an intersection of the selected row and selected column that are accessed by the X+Y-bit word during write/erase operations. A WRITE_ENABLE control signal is applied to both a write enable (WEA) terminal and a port enable (ENA) terminal, and is asserted (e.g., logic high) during write and erase operations. A reset (RST) terminal of PORT A is disabled, e.g., by a logic low ("0") value. A first clock (WRITE_CLK) signal is applied to a clock (CLKA) terminal of PORT A.

Referring to the lower portion of dual-port RAM 100, the terminals of PORT B are configured for data match operations as follows. Address terminal ADDRB of PORT B is configured to receive an X-bit data match (MATCH_DATA) word that accesses (reads) a selected row of memory cells during data match operations, thereby causing the contents of the selected row to be transmitted to data output port (DOB). A data input (DINB) terminal and a write enable (WEB) terminal receive logic low signals. A MATCH_ENABLE control signal is applied to a port enable (ENB) terminal, and is asserted during data match operations. A MATCH_RESET control signal is applied to a reset (RSTB) terminal, and is asserted during data match operations to reset an output circuit (described below) of the dual-port RAM. Finally, a second clock (MATCH_CLK) signal is applied to a clock (CLKB) terminal of PORT B.

Figure 2A:
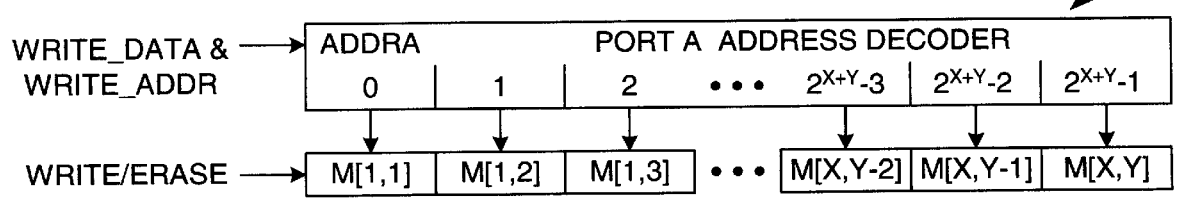
FIGS. 2(A) and 2(B) are simplified diagrams respectively depicting configurations of first and second input ports of the dual-port RAM shown in FIG. 1.
Figure 2B:
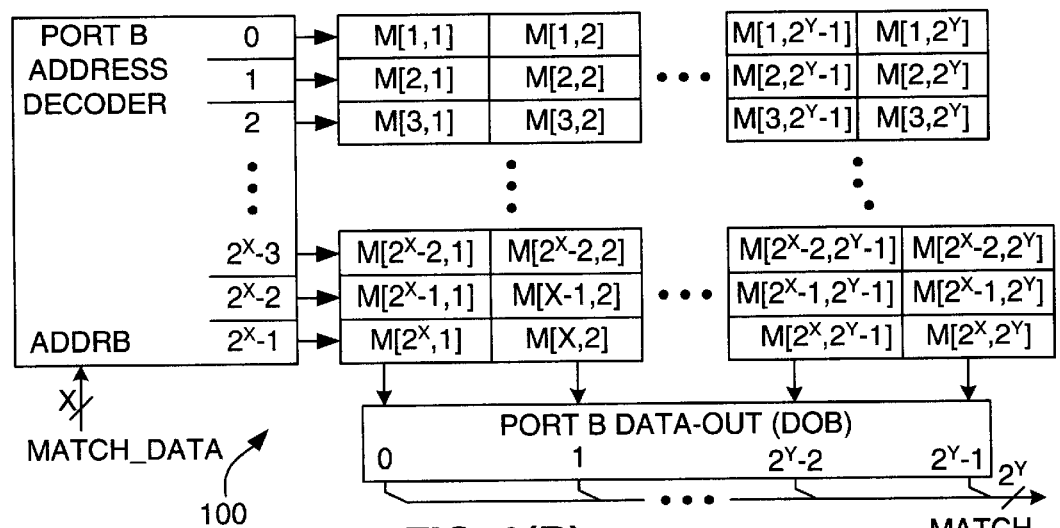

FIGS. 2(A) and 2(B) are simplified diagrams that functionally illustrate how PORT A and PORT B, respectively, access the memory cells of dual-port RAM 100. The $2^{X+Y}$ memory cells of dual-port RAM 100 are represented in FIGS. 2(A) and 2(B) as cells M[1,1] through M[X,Y].

Referring to FIG. 2(A), PORT A is configured to decode an X+Y-bit address made up of both an X-bit row address word (i.e., WRITE_DATA) and a Y-bit column address word (i.e., WRITE_ADDR) to address a selected memory cell in the memory array of dual-port RAM 100. For example, the X+Y-bit address "00 . . . 010" is decoded by the PORT A address decoder as address "2", thereby writing an input data value to memory cell M[1,3] (e.g., a memory cell located in the first row, third column of the memory array). In effect, the $2^{X+Y}$ memory cells of dual-port RAM 100 are addressed as a 1-by-$2^{X+Y}$ memory array through PORT A, as depicted in FIG. 2(A).

Referring to FIG. 2(B), PORT B is configured to access one row of the $2^{X+Y}$ memory cells M[1,1] through M[$2^X$, $2^Y$] in response to an X-bit MATCH_DATA word. For example, the X-bit address "00 . . . 011" is decoded by the PORT B address decoder as address "3", thereby reading the data value from the third row of the memory array (i.e., including memory cells M[3,1] through M[3,$2^Y$]), and causing these read data values to appear on pins 0 through $2^Y$–1 of the DOB terminal. In effect, the $2^{X+Y}$ memory cells memory cells of dual-port RAM 100 are addressed as a $2^X$-by-$2^Y$ memory array through PORT B, as depicted in FIG. 2(B).

Figures 3A, 3B:
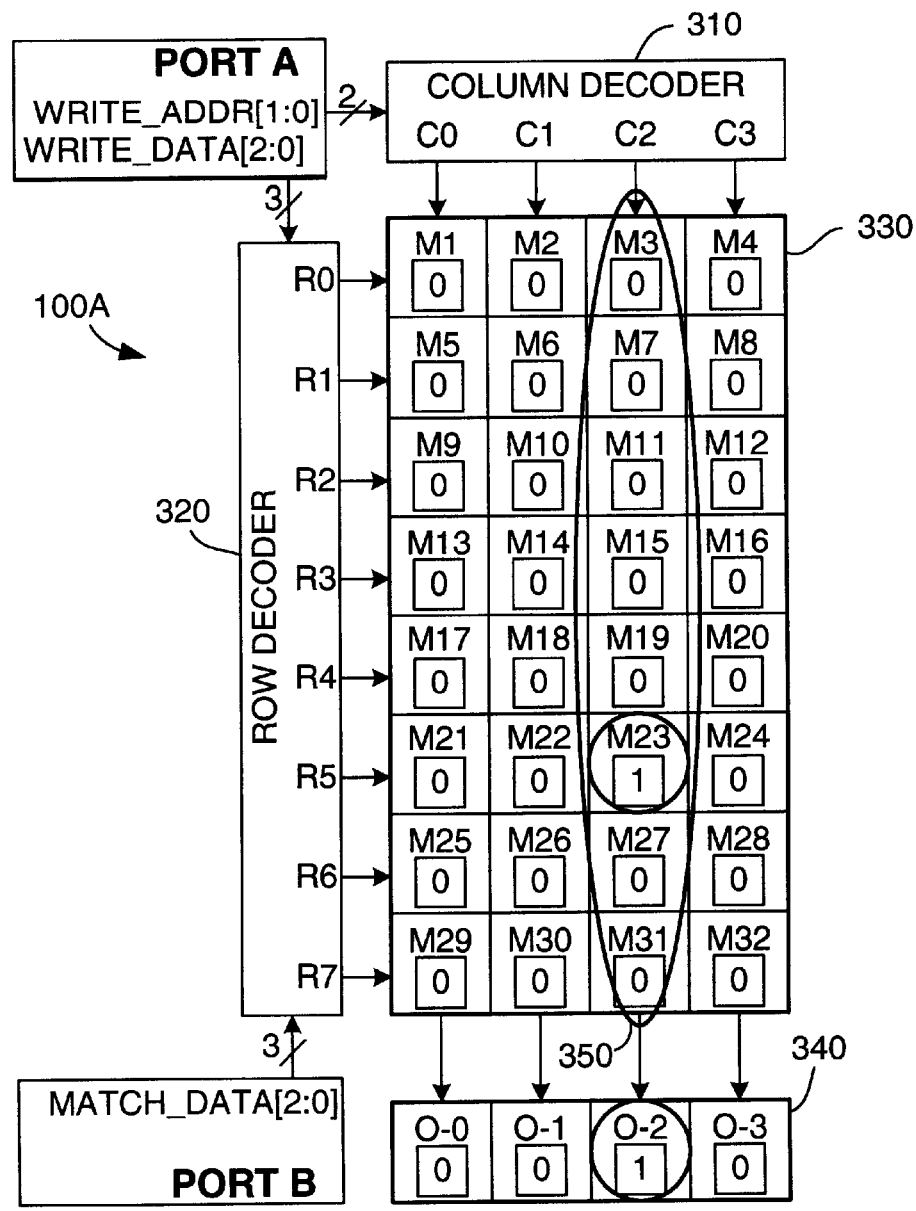
FIG. 3(A) is a block diagram showing a dual-port RAM configured in accordance with another embodiment of the present invention.
FIG. 3(B) is a diagram illustrating a decoded "one hot" data word that is stored in the dual-port RAM shown in FIG. 3(A).

FIG. 3(A) is a block diagram showing a dual-port RAM 100A including a 32-bit memory array that represents a simplified embodiment of dual-port RAM 100 (shown in FIG. 1). In addition to PORT A and PORT B (which omit some of the control terminals shown in FIG. 1 for brevity), dual-port RAM 100A includes a column decoder 310, a row decoder 320, a memory array 330, and an output circuit 340. In accordance with the first main aspect of the present invention, PORT A receives a 5-bit word that includes a 2-bit encoded write address (WRITE_ADDR) word and a 3-bit encoded WRITE_DATA word, and PORT B receives a 3-bit encoded MATCH_DATA word. Column decoder 310 decodes the 2-bit encoded WRITE_ADDR word during write and erase operations, and transmits a column control signal from a selected column output terminal C0 through C3 in response to the decoded WRITE_ADDR word. Similarly, row decoder 320 decodes the 3-bit encoded WRITE_DATA word during write and erase operations, and transmits a row control signal from a selected row output terminal R0 through R7 in response to the decoded WRITE_DATA word. Memory array 330 includes thirty-two (32) memory cells M1 though M32 that are arranged in eight rows and four columns. Each memory cell is accessed by an associated column output terminal C0 through C3 and an associated row output terminal R0 through R7. For example, memory cell M23 is accessed by column output terminal C2 and row output terminal R5. Output circuit 340 includes output terminals O-0 through O-3 that are connected to each column of memory array 330. During data match operations, the contents of one row of memory cells is transmitted to output circuit 340.

Decoded "One Hot" Data Words

As used herein, a decoded "one hot" data word is a related group of data bits that includes only one logic "1" bit (all other bits are logic "0"), and the decimal value of each decoded "one hot" data word is determined by the bit position of the logic "1" bit. In accordance with an embodiment of the present invention, each decoded "one hot" data word is stored in one column of memory cells in the memory array of a dual-port RAM (i.e., each column of the memory array stores one decoded "one hot" data word), and the decimal value of each decoded "one hot" data word is determined by the row in which the logic "1" bit value is stored. In particular, the rows of the memory array are assigned sequential row numbers such that a row including memory cells located at an upper end of each column corresponds to the least significant positions of the decoded "one hot" data words (i.e., the decimal zero positions), and a row including memory cells located at a lower end of each column corresponds to the most significant positions of the decoded "one hot" data words (the terms "column", "row", "upper end", and "lower end" indicate logical relationships between the memory cells of memory array 330, and are not necessarily limited to physical relationships between the memory cells). The address of a decoded "one hot" data word is the column number (as determined by the column decoder) in which the decoded "one hot" data word is stored. Accordingly, by storing data in a dual-port RAM using this decoded "one hot" data word format, a match data word can be compared with multiple stored data values during a single clock cycle using the match data word to read a corresponding row of the memory array. Moreover, a "match" occurs if any of the memory cells of the corresponding row contain a logic "1" bit value, and the address of the matching data word is easily determined by identifying the position of the logic "1" bit value in the decoded word that is read from the corresponding row.

Using the definitions provided above, an 8-bit decoded "one hot" data word can have a decimal value between 0 and 7, depending upon the position of the logic "1" bit. In the eight-bit example, the decoded "one hot" data word "00000001" has a decimal value of zero (i.e., the logic "1" is located in the least significant bit), and the decoded "one hot" data word "00000100" has a decimal value of two (i.e., the logic "1" is located two bit positions to the left of the least significant bit). The decimal values of larger decoded "one hot" data words are similarly determined. For example, a 256-bit decoded "one hot" data word can have a decimal value between zero (i.e., 000 . . . 0001) and 255 (i.e., 100 . . . 000).

The address and decimal value of a sample 8-bit decoded "one hot" data word 350 is now explained with reference to FIGS. 3(A) and 3(B). As mentioned above, the address of 8-bit decoded "one hot" data word 350 is determined by the column in which it is stored. In the present example, as shown in FIG. 3(A), decoded "one hot" data word 350 is stored in the column connected to terminal C2 of column decoder 310. As mentioned above, the decimal value of 8-bit decoded "one hot" data word 350 is determined by the bit position of its logic "1" bit value. As shown in FIG. 3(A), column C2 includes the eight memory cells M3, M7, M11, M15, M19, M23, M27, and M31, and the logic "1" bit value of decoded "one hot" data word 350 is stored in memory cell M23. Referring to FIG. 3(B), memory cell M23 is located in bit position 5 (i.e., corresponding to the row connected to terminal R5 of row decoder 320). Therefore, the decimal data value of decoded "one hot" data word 350 is five. Note that when the row containing memory cell M23 is read during a data match operation, the logic "1" bit value read from memory cell M23 appears at output terminal O-2 of output port 340. Accordingly, the address (i.e., column C2) of decoded "one hot" data word 350 can be identified by the location of the logic "1" bit value (i.e., output terminal O-2) in the output data word.

Decoded "one hot" data words and their usefulness in implementing CAM functions in a dual-port RAM are further explained in the following examples.

CAM Function Implementation

Figure 4A:
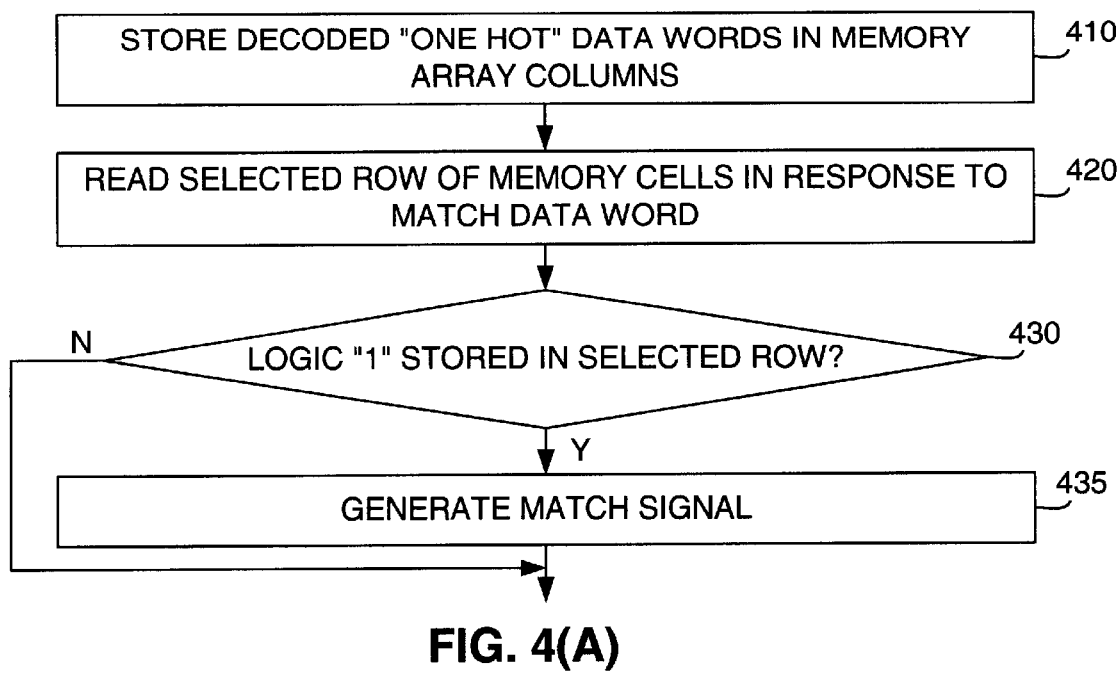
FIGS. 4(A) and 4(B) are flow diagrams showing basic steps associated with methods of implementing a CAM function using a dual-port RAM in accordance with the present invention.
Figure 4B:
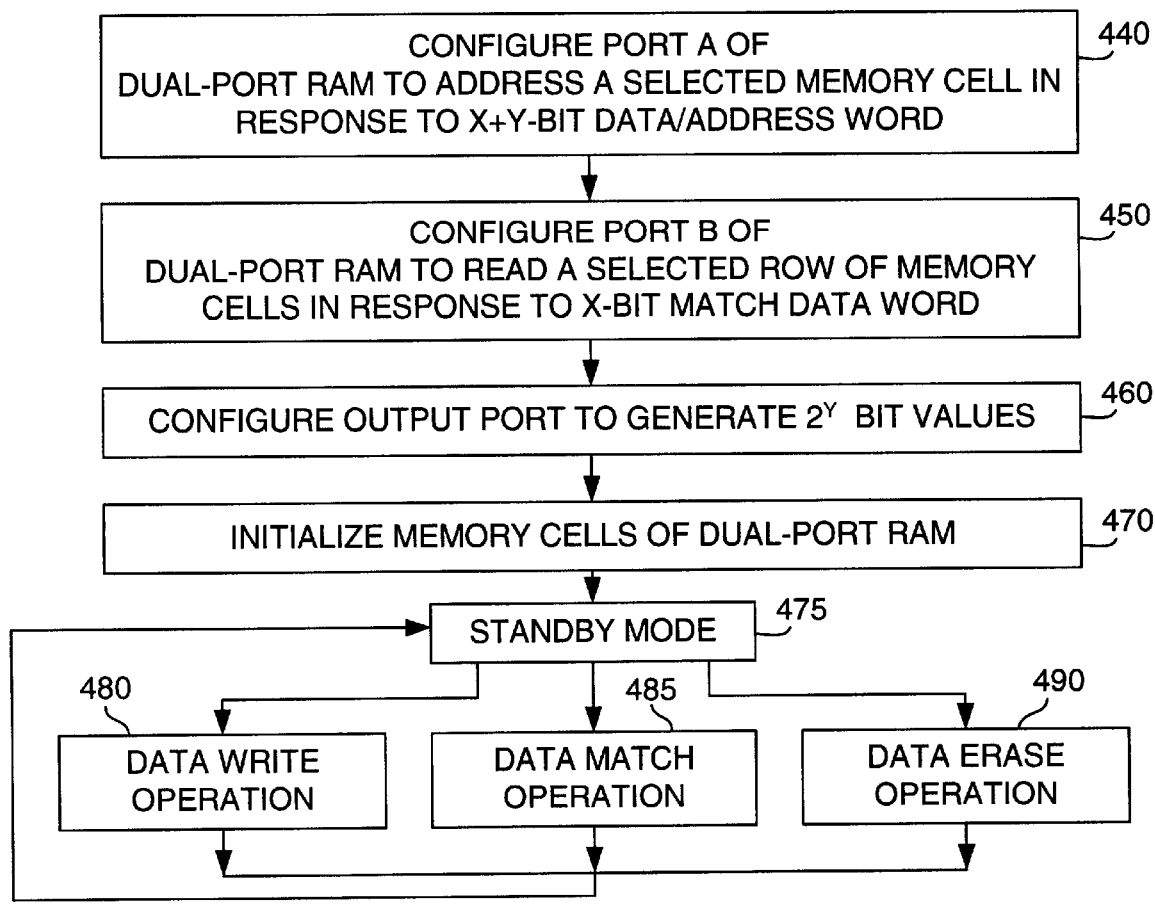

FIGS. 4(A) and 4(B) are flow diagrams showing the basic steps associated with implementing CAM functions using dual-port RAM 100 in accordance with the main aspects of the present invention.

FIG. 4(A) is a flow diagram including basic method steps performed during the operation of a dual-port RAM to implement CAM functions in accordance with the first main aspect of the present invention. As described in detail above, the method includes storing one or more decoded "one hot" data words in the memory array of the dual-port RAM such that each decoded "one hot" data word is stored in an associated column of memory cells in the memory array (step 410). This data storage step can be performed either during configuration of the dual-port RAM, or during an initial data write operation utilizing the configuration associated with the second main aspect of the present invention (described above). After the one or more decoded "one hot" data words are stored in the columns of the memory array, a data match operation is performed (step 420) by reading a selected row of memory cells from the memory array in response to a match data value that is applied to an input port (e.g., PORT B of dual-port RAM 100; see FIG. 1). As described above, when multiple decoded "one hot" data words are stored in the columns of the memory array, one bit of each of the decoded "one hot" data words is stored in each row. Therefore, when a selected row is read in response to the match data value, an output word containing bit values from each decoded "one hot" data word is transmitted to the output port of the dual-port RAM. The output word is then tested to determine whether any of the bit values are logic "1" bit values (step 430), thereby indicating that one or more of the decoded "one hot" data words stored in the memory array matches the match data value. If so, a match signal is generated that signals the occurrence of a data match (step 435). Accordingly, the dual-port RAM performs a CAM function without requiring dedicated CAM circuitry.

FIG. 4(B) is a flow diagram showing basic steps associated with configuration of a dual-port RAM prior to the implementation of CAM functions in accordance with the second main aspect of the present invention.

Referring to FIG. 4(B), steps 440 through 460 are directed to configuring dual-port RAM 100 (see FIG. 1) such that PORT A and PORT B decode encoded words that are received from an external source (not shown). In particular, according to step 440, PORT A is configured to address a selected memory cell of a dual-port RAM in response to an X+Y-bit encoded data/address word and, according to step 450, PORT B is configured to read a selected row (group) including $2^Y$ memory cells in response to an X-bit match data word. Additional details regarding the configuration of PORT A and PORT B are provided above. In step 460, the output port (e.g., DOB in FIG. 1) is configured to transmit the $2^Y$ data bit values read from the selected row of memory cells to external circuitry (not shown). Although shown as separate steps that occur in sequence for explanatory purposes, steps 440, 450 and 460 can be performed in any order, or may be performed simultaneously.

In addition to configuring PORT A and PORT B, it is necessary for all memory cells of dual-port RAM 100 to be initialized to preset values (Step 470) before dual-port RAM 100 implements CAM functions. In one embodiment, initialization involves storing a logic "0" in all of the memory cells using any known method, such as sequentially writing logic "0" values to each memory cell, or utilizing reset circuitry that resets all of the memory cells simultaneously. In another embodiment, decoded "one hot" data words are pre-loaded into the memory cells of dual-port RAM 100.

After configuration and initialization, dual-port RAM 100 enters a standby mode (Step 475) in which dual-port RAM 100 awaits external command and data signals. In response to these command/data signals, dual-port RAM 100 exits the standby mode to perform either a data write operation (step 480), a data match operation (step 485), or an erase operation (step 490). Each of these operations is described in additional detail below. At the conclusion of the performed operations, dual-port RAM 100 returns to the standby mode (Step 475) to await subsequent command/data signals.

Figure 5A:
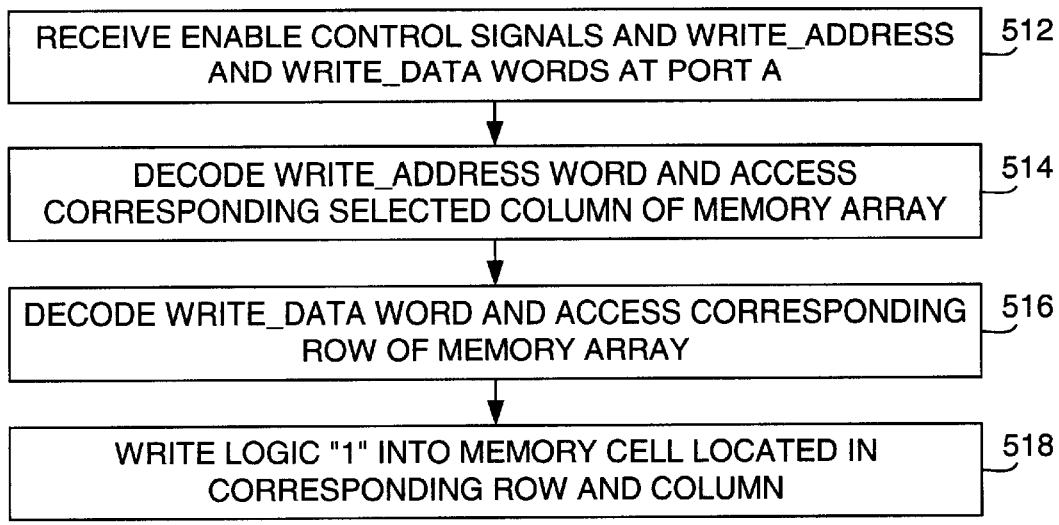
FIGS. 5(A), 5(B), and 5(C) are flow diagrams respectively showing write, data match, and erase operation steps that are used in the methods shown in FIGS. 4(A) and 4(B).
Figure 5B:
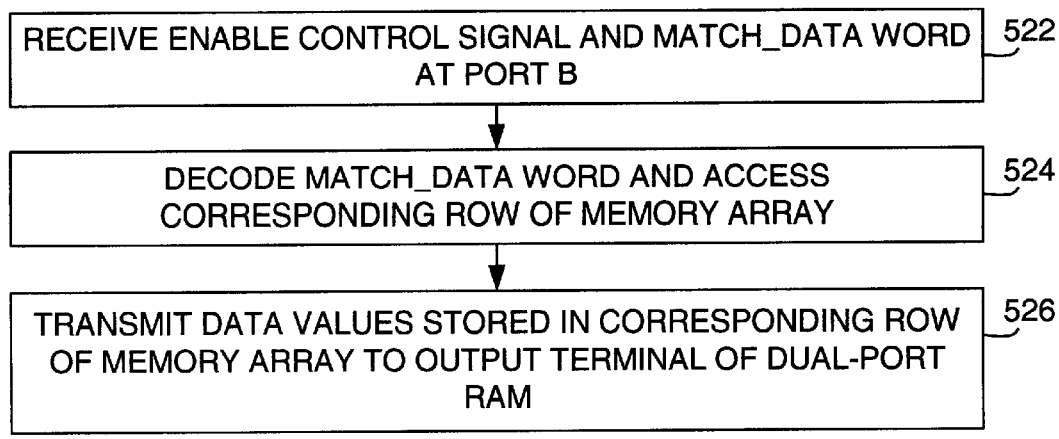
Figure 5C:
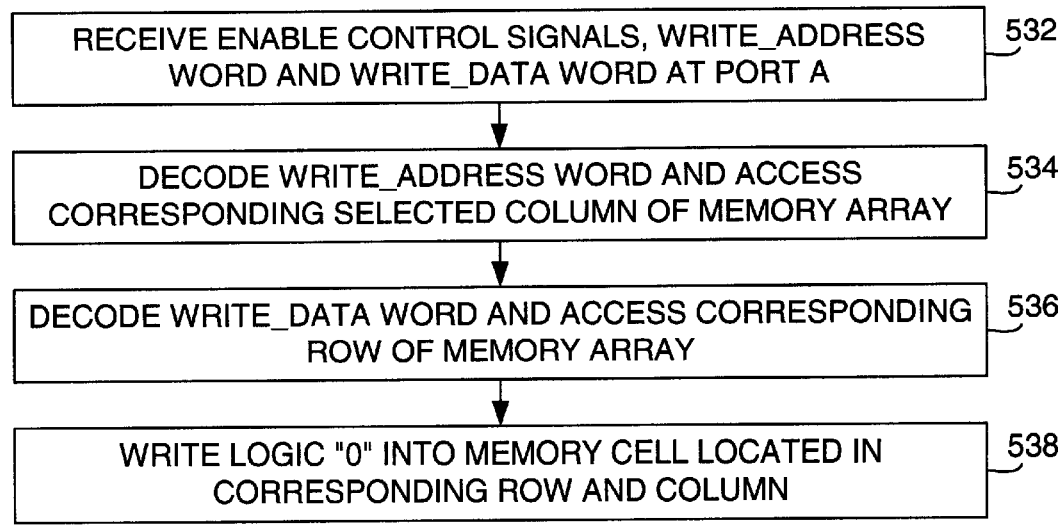

FIGS. 5(A) through 5(C) are flow diagrams showing process steps associated with data write operations, data match operations, and erase operations, respectively, that are performed by a dual-port RAM in accordance with the present invention. The data write operation steps shown in FIG. 5(A) correspond to the storage of decoded "one hot" data words performed in step 410 of FIG. 4(A), and also with data write operation performed in step 480 of FIG. 4(B). The data match operation steps shown in FIG. 5(B) correspond to the read operation performed in step 420 of FIG. 4(A), and also to the data match operation performed in step 485 of FIG. 4(B). Finally, the data erase operation steps shown in FIG. 5(C) correspond to the data erase operation performed in step 490 of FIG. 4(B).

Referring to FIGS. 1 and 5(A), CAM write operations are performed by addressing a selected row and selected column of the memory array of dual-port RAM 100, and writing a logic "1" bit value into the memory cell located at an intersection of the selected row and selected column, thereby storing a decoded data value in the memory array. In particular, a write operation begins when externally-generated control signals and an X+Y-bit word are received at the terminals of PORT A (step 512). Referring to FIG. 1, in one embodiment, the control signals include an asserted WRITE_ENABLE control signal that is received by the write enable (WEA) terminal and port enable (ENA) terminals of PORT A, and a clock (WRITE_CLK) signal that is received by the clock (CLKA) terminal of PORT A. The X+Y-bit word includes an X-bit WRITE_DATA word and a Y-bit WRITE_ADDR word that are received by the address (ADDRA) terminal of PORT A. In addition to the control signals and X+Y-bit word, a WRITE/ERASE word having a logic "1" bit value is applied to the data input (DINA) terminal of PORT A.

Referring again to FIG. 5(A), the Y-bit WRITE_ADDR word and the X-bit WRITE_DATA word are then decoded to identify a corresponding column and a corresponding row of the memory array (steps 514 and 516). In particular, the Y-bit WRITE_ADDR word is decoded by a column decoder to access a selected column of the memory array (step 514), and the X-bit WRITE_DATA word is decoded by a row decoder to access a selected row of the memory array (step 516), thereby addressing a selected memory cell located at the intersection of the selected row and selected column. Although this decoding process is illustrated as separate steps in FIG. 5(A), the decoding process is essentially performed simultaneously by dual-port RAM 100.

In a final step of the write operation, the logic "1" WRITE/ERASE value applied at the data input (DINA) terminal of PORT A is written (stored) in the selected memory cell located at the intersection of the selected row and selected column (step 518). By writing a logic "1" into the selected memory cell, a decoded "one-hot" data word is stored in dual-port RAM 100 whose address is defined by the selected column, and whose decoded data value is defined by the selected row. Additional details regarding such decoded "one-hot" data words are provided below.

Data match operations will now be described with reference to FIGS. 1, 3(A), and 5(B). Data match operations are performed after one or more decoded "one-hot" data words are stored in dual-port RAM 100, and the MATCH_RST control signal is asserted to initialize the output word (i.e., referring to FIG. 3(A), each output terminal O-0 through O-3 of output circuit 340 is reset to store a logic "0"). Data match operations are initiated with the transmission of appropriate control signals and an X-bit encoded match data word that is received at the terminals of PORT B (step 522). In particular, referring to FIG. 1, the MATCH_ENABLE control signal applied to the port enable (ENB) terminal is asserted, and the match data (MATCH_DATA) word is applied to the address (ADDRB) terminal of PORT B. The encoded match data word is then decoded by the row decoder of dual-port RAM 100 to access a selected row of memory cells that corresponds to the encoded data match word (step 524). Finally, data values are read from the selected row of memory cells and are transmitted to the data output (DOB) terminal of dual-port memory 100 (step 526).

Referring to FIGS. 1 and 5(C), decoded "one hot" data values are selectively erased from dual-port RAM 100 by writing logic "0" into the memory locations previously storing logic "1" values. Similar to data write operations, erase operations begin when externally-generated control signals and an X+Y-bit word are received at the terminals of PORT A (step 532). The X+Y-bit word corresponds to a selected memory cell storing a logic "1" bit value to be erased. In addition to the control signals and X+Y-bit word, a WRITE/ERASE word having a logic "0" bit value is applied to the data input (DINA) terminal of PORT A. The Y-bit WRITE_ADDR word and the X-bit WRITE_DATA word are then decoded to access the selected memory cell by identifying a corresponding column and a corresponding row of the memory array (steps 534 and 536). Finally, the logic "0" WRITE/ERASE value is written (stored) in the selected memory cell (step 538), thereby erasing the previously-stored logic "1" bit value.

The basic methods described above are described below with reference to simplified examples.

FIGS. 6, 7(A), 7(B), and 8 are block diagrams showing portions of dual-port RAM 100A (see FIG. 3(A)) that illustrate simplified examples of CAM functions (i.e., write, data match, and erase operations) in accordance with the present invention. In particular, these figures illustrate simplified examples of a write operation in which decoded "one hot" data words are stored in memory array 330 through PORT A of dual-port RAM 100A, data match operations in which encoded match data words are decoded and compared with stored decoded "one hot" data words through PORT B of dual-port RAM 100A, and an erase operation in which a decoded "one hot" data word is selectively erased from memory array 330 using PORT A.

Figure 6:
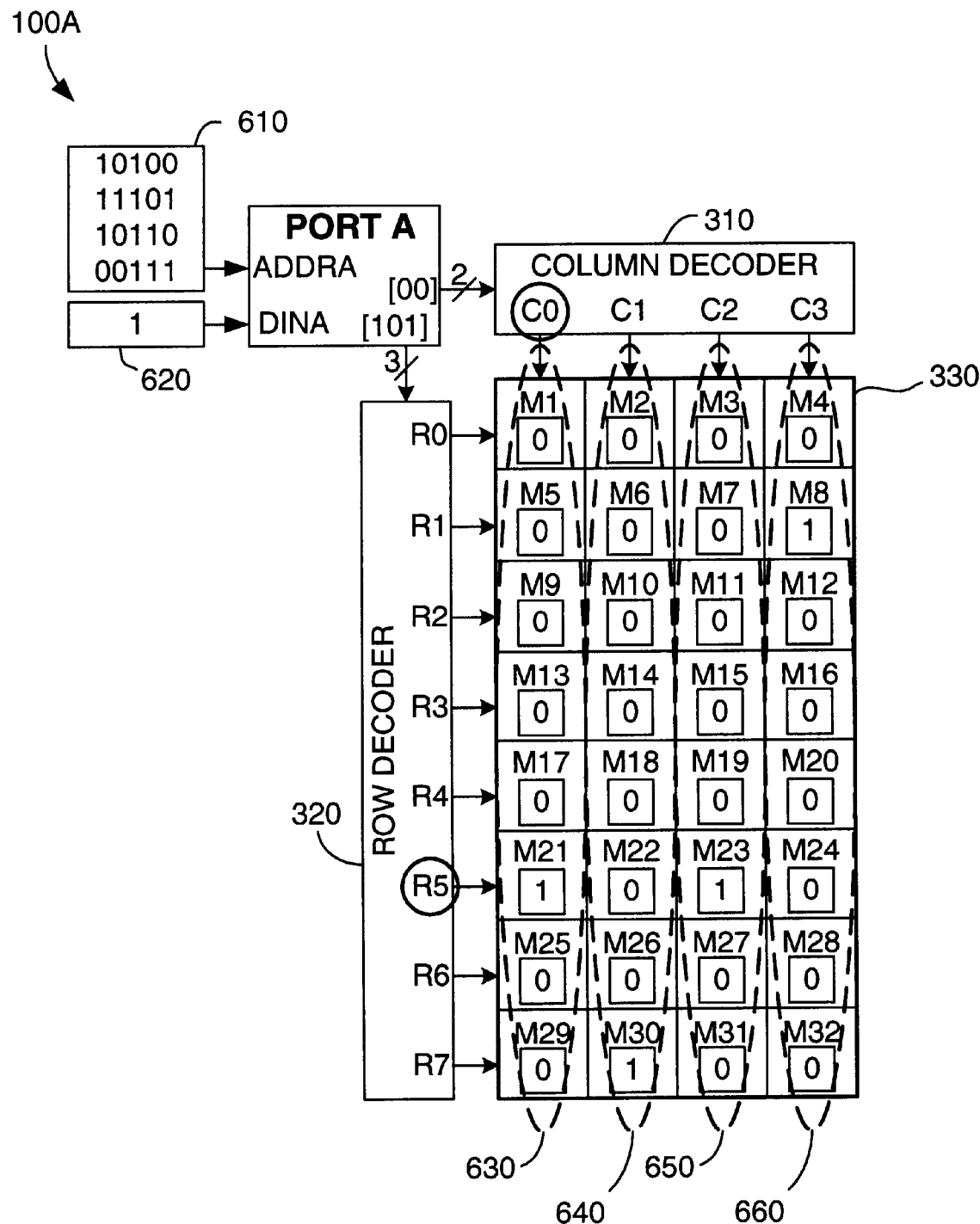
FIG. 6 is a block diagram showing a portion of the dual-port RAM of FIG. 3(A) for purposes of illustrating a data write operation.

FIG. 6 illustrates a simple example in which a series of encoded X+Y-bit (i.e., 5-bit) encoded data words 610 are transmitted to the address (ADDRA) terminal of PORT A of dual-port RAM 100A, and stored as decoded "one hot" data words in memory array 330. As mentioned above, a key factor for implementing CAM functions in a dual-port RAM is storing data values in the memory array of the dual-port RAM in the decoded "one hot" data word format. In the present example, each decoded "one hot" data word is automatically stored in a column of the memory array according to the 5-bit encoded data word. In addition to encoded 5-bit word 610, a WRITE/ERASE data signal 620 having a logic "1" bit value is applied to the data input (DINA) terminal of PORT A.

Referring to FIG. 6, at the start of each write operation, a data word from a series of 5-bit encoded data words 610 is received by PORT A of dual-port RAM 100A (see step 512, FIG. 5(A)). As discussed above, PORT A separates each 5-bit word into a 3-bit write data portion that is transmitted to row decoder 320, and a 2-bit write address portion that is transmitted to column decoder 310. For example, the 5-bit word "10100" is separated into the 3-bit write data portion "101" (i.e., the three most significant bits of the 5-bit data word) and the 2-bit write address portion "00" (which comprises the two least significant bits of the 5-bit data word). Row decoder 320 then decodes the write data portion and accesses the corresponding row of memory cells (see step 516, FIG. 5(A)). For example, the 3-bit write data portion "101" is decoded by row decoder 320 and accesses the memory cells connected to terminal R5 (i.e., memory cells M21 through M24). At the same time, column decoder 310 decodes the write address portion of the 5-bit word and accesses the corresponding column of memory cells (see step 514, FIG. 5(A)). For example, the 2-bit write address portion "00" is decoded by column decoder 310 and accesses the memory cells connected to terminal C0 (i.e., memory cells M1, M5, M9, M13, M17, M21, M25, and M29). Finally, the memory cell located at the intersection of the selected row and selected column (i.e., memory cell M21) is biased to store the logic "1" data bit 620 applied to the data input (DINA) terminal of PORT A (see step 518, FIG. 5(A)).

As indicated in the above example, PORT A of the dual-port RAM 100A is configured to write decoded "one hot" data word 630 into memory array 330 by accessing selected memory cell M21 in response to the 5-bit word "10100". That is, by writing a logic "1" bit value into memory cell M21 in response to the 5-bit word "10100", a decoded "one hot" data word 630 is automatically stored in column C0 of memory array 330. Because the process of writing one bit value into the memory array of a dual-port RAM is typically performed in one clock cycle, the present invention facilitates writing (storing) decoded "one hot" data word 630 into memory array 330 in a single clock cycle in response to the 5-bit word "10100".

In addition to decoded "one hot" data word 630, three additional decoded "one hot" data words are written into memory array 330 in response to corresponding encoded 5-bit words. Specifically, decoded "one hot" data word 640 is stored in column C1 and includes a logic "1" bit value stored in memory cell M30 in response to 5-bit word "11101". Similarly, decoded "one hot" data word 650 is stored in column C2 and includes a logic "1" bit value stored in memory cell M23 in response to 5-bit word "10110", and decoded "one hot" data word 660 is stored in column C3 and includes a logic "1" bit value stored in memory cell M8 in response to 5-bit word "00111".

Figure 7A:
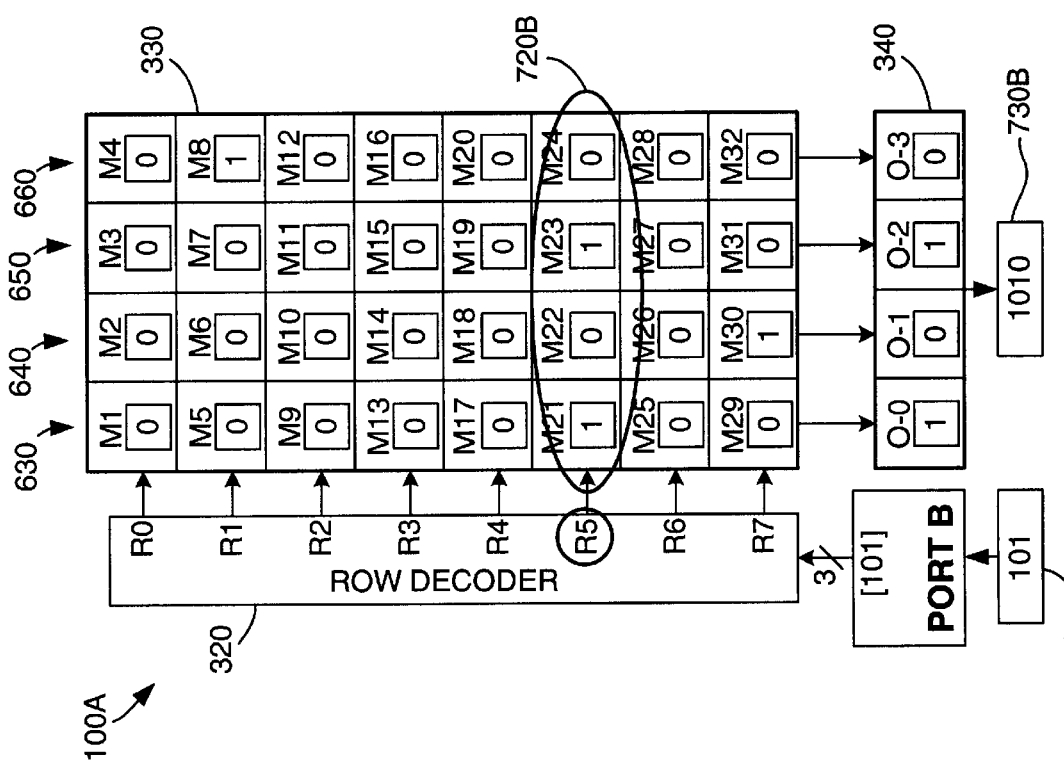
FIGS. 7(A) and 7(B) are block diagrams showing portions of the dual-port RAM of FIG. 3(A) for purposes of illustrating a data match operation.
Figure 7B:
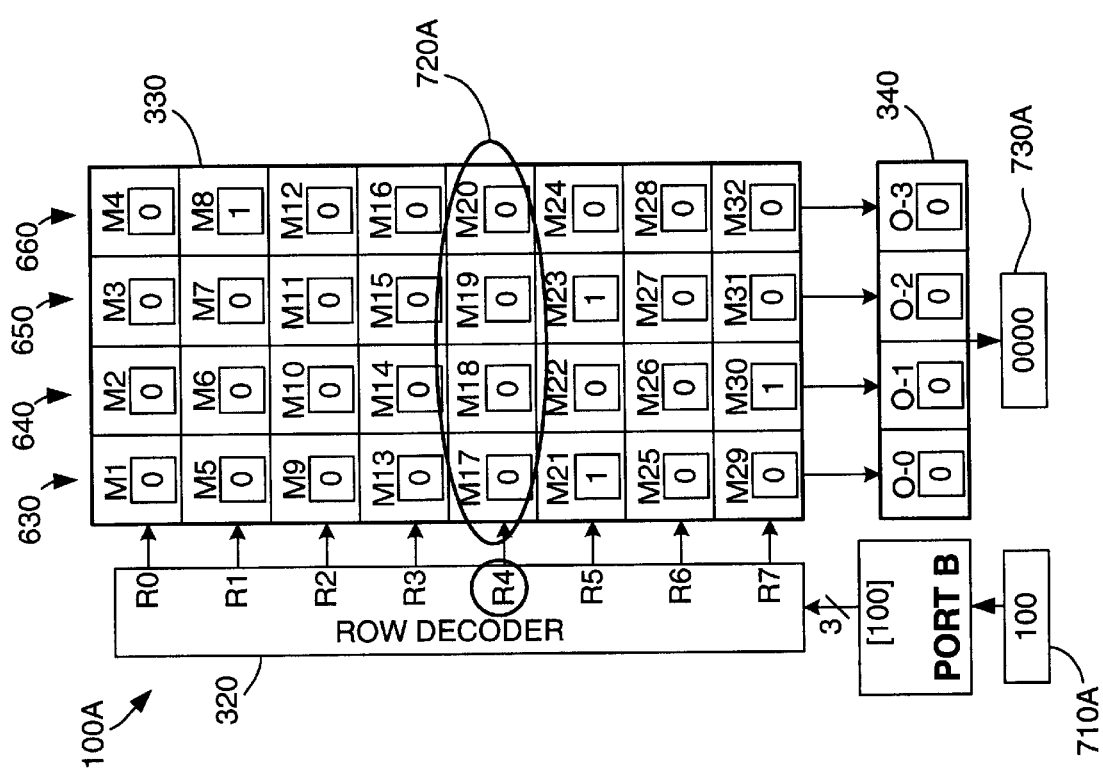

FIGS. 7(A) and 7(B) illustrates an example in which two encoded X-bit (i.e., 3-bit) match data words 710A and 710B are transmitted to the address (ADDRB) terminal of PORT B of dual-port RAM 100A during the implementation of two CAM data !o match operations. Note that memory array 330 stores decoded "one hot" data words 630, 640, 650, and 660, which are discussed above.

As discussed above, the 3-bit match data words received by PORT B are transmitted to row decoder 320 (see step 522, 5 FIG. 5(B)). Specifically, 3-bit match data word 710A (i.e., "100") is transmitted to decoder 320 in the example shown in FIG. 7(A), and 3-bit match data word 710B (i.e., "101") is transmitted to decoder 320 in the example shown in FIG. 7(B). Row decoder 320 then decodes the applied match data word and accesses the corresponding row of memory cells (see step 524, FIG. 5(B)). For example, during the data match operation shown in FIG. 7(A), 3-bit match data word 710A ("100") is decoded by row decoder 320 to access the memory cells connected to terminal R4 (i.e., memory cells M17 through M20). Similarly, in the data match operation shown in FIG. 7(B), 3-bit match data word 710B ("101") is decoded by row decoder 320 to access the memory cells connected to terminal R5 (i.e., memory cells M21 through M24). Finally, the data bit values stored in the memory cells of the selected row are transmitted to output terminal 340. In the data match operation shown in FIG. 7(A), the contents of row R4 that are stored in output terminals O-0 through O-3 is "0000", thereby indicating that none of the decoded "one hot" data words stored in memory array 330 matches applied match data word 710A. Conversely, in the data match operation shown in FIG. 7(B), the contents of row R5 that are stored in output terminals O-0 through O-3 is "1010", thereby indicating that two of the decoded "one hot" data words (i.e., decoded "one hot" data words 630 and 650) include data that matches applied match data word 710B.

As indicated in the above example, PORT B of dual-port RAM 100A is configured to automatically perform CAM data match operations by reading the bit values stored in the memory cells of one row of the memory array in response to a 3-bit encoded match data word. Each match data word 710A and 710B is simultaneously compared with all four decoded "one hot" data words 630, 640, 650, and 660 by applying the match word to row decoder 330, and reading the corresponding row that is addressed by the row decoder. Further, the address of each decoded "one hot" data word that matches the data match word is easily identified by the bit position of the logic "1" bit value in the decoded output word appearing in output terminals O-0 through O-3.

Figure 8:
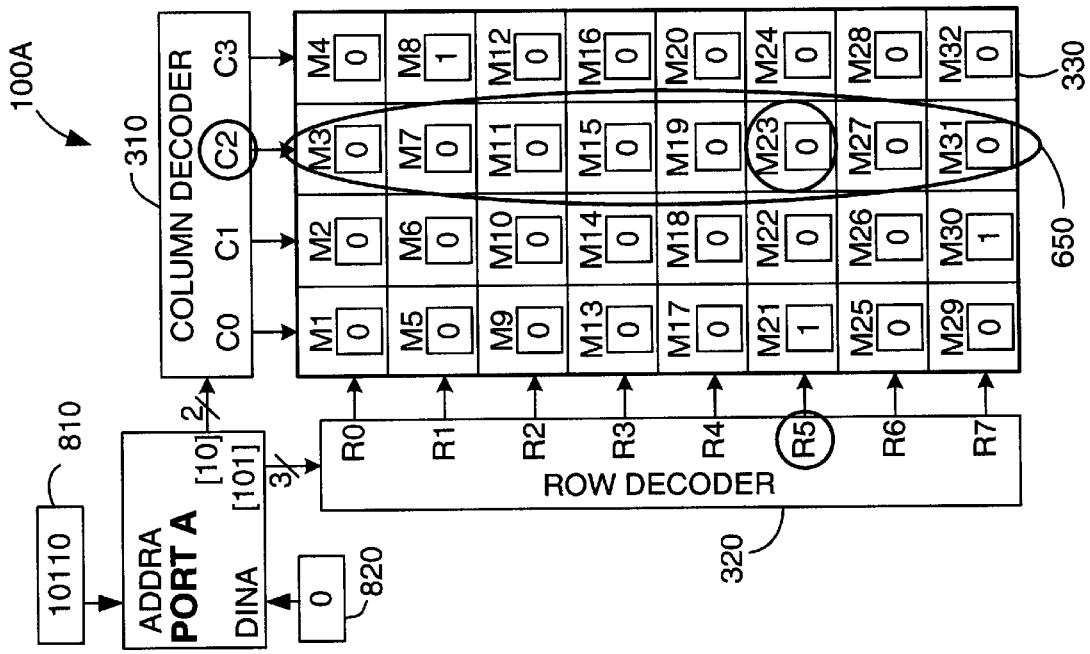
FIG. 8 is a block diagram showing a portion of the dual-port RAM of FIG. 3(A) for purposes of illustrating an erase operation.

Finally, FIG. 8 illustrates a simple example in which a selected decoded "one hot" data word (i.e., 650) is erased during a CAM data erase operation. The data erase operation is essentially identical to the data write operation used to write decoded "one hot" data word 650, with the exception that a logic "0" value is applied to the data input (DINA) terminal of PORT A. Specifically, an encoded 5-bit data word 810 (i.e., "10110") is received by the address (ADDRA) terminal of PORT A (see step 532, FIG. 5(C)), which is separated and decoded to access memory cell M23 in the manner described above with respect to the write operations (see steps 534 and 536, FIG. 5(C)), and then the logic "0" write/erase value 820 is stored in memory cell M23 to overwrite the logic "1" previously associated with decoded "one hot" data word 650. Accordingly, similar to CAM write operations, PORT A of the dual-port RAM 100A is configured to erase decoded "one hot" data words from memory array 330 in a single clock cycle.

Implementation in Programmable Logic Devices

The methods for implementing CAM functions using dual-port RAMs according to the present invention are particularly useful when implemented in Programmable Logic Devices (PLDs) because they allow a PLD to support CAM functions without the need for dedicated CAM circuitry, thereby providing additional die space for general-purpose logic resources on the PLD.

The present invention is described below with specific reference to a particular type of PLD known as field programmable gate arrays (FPGAs) that are provided with dual-port RAMs, such as the Virtex™ family of FPGAs produced by Xilinx®, Inc., of San Jose, Calif. Although the present invention is described below with particular reference to Virtex FPGAs, some or all of the various aspects of the present invention may be beneficially utilized in other FPGAs and other types of PLDs having dual-port RAMs similar to those provided in Virtex FPGAs. Therefore, the appended claims should not necessarily be limited to Virtex FPGAs.

Virtex Overview: Logic and Configuration Planes

Figure 9:
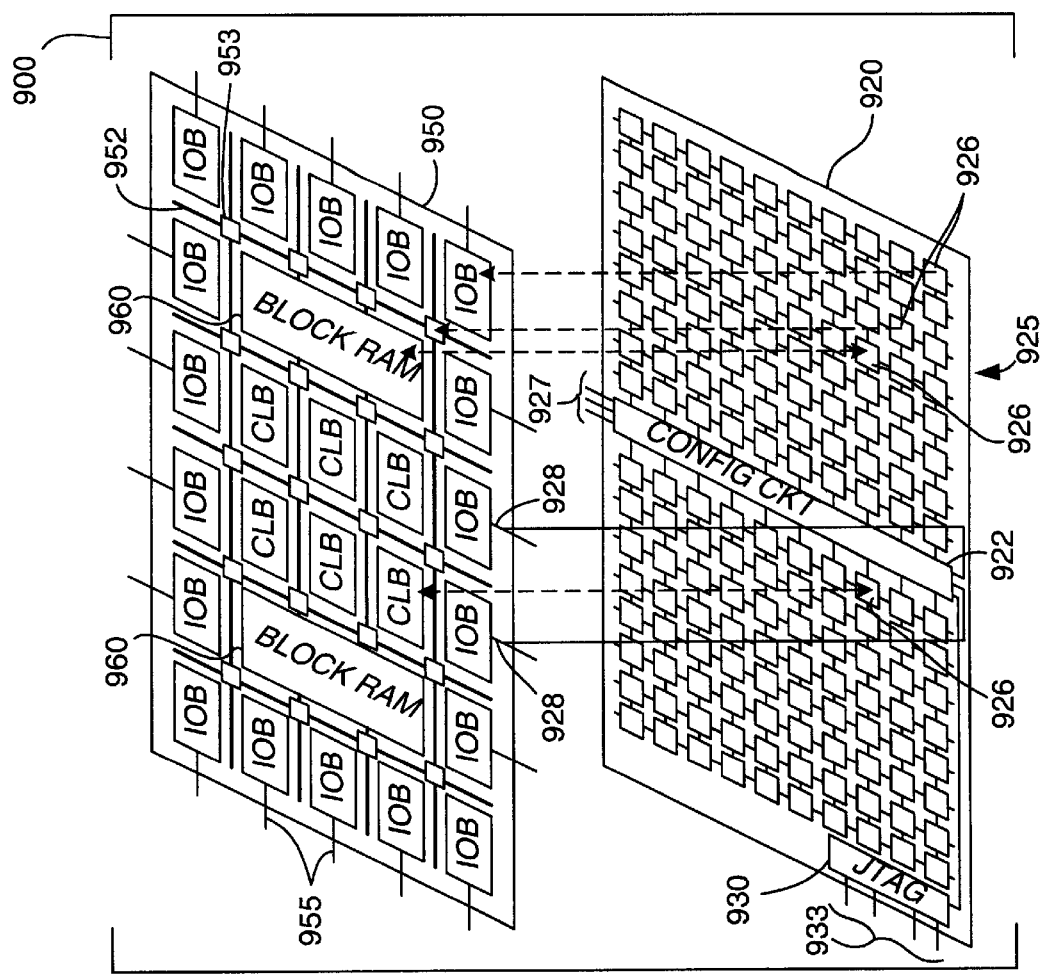
FIG. 9 is a perspective view showing logic and configuration planes of an FPGA.

FIG. 9 is a split-level perspective view showing a simplified representation of a Virte™ FPGA 900. Similar to most integrated circuits, FPGA 900 includes programmable circuitry formed on a semiconductor substrate that is housed in a package having externally accessible pins. This programmable circuitry can be functionally separated into a configuration plane 920 and a logic plane 950. Other simplifications and functional representations of the circuitry and features of Virtex FPGAs are utilized in the following description. For additional detail regarding Virtex FPGAs, the reader is referred to the Xilinx Programmable Logic Data Book 1999, pages 3-1 through 3-60, which are incorporated herein by reference.

Configuration plane 920 generally includes a configuration circuit 922 and configuration memory array 925. Configuration circuit 922 includes several input and/or output terminals that are connected to dedicated configuration pins 927 and to dual-purpose input/output (I/O) pins 928. Configuration memory array 925 includes memory cells 926 that are arranged in "frames" (i.e., columns of memory cells extending the length of FPGA 900), and addressing circuitry (not shown) for accessing each frame. JTAG (Boundary Scan) circuitry 930 is included in configuration plane 920, and is also connected to at least one terminal of configuration circuit 922. JTAG circuit 930 includes the four well-known JTAG terminals 933 (i.e., TDI, TDO, TMS, and TCK). During configuration of FPGA 900, configuration control signals are transmitted from dedicated configuration pins 927 to configuration circuit 922. In addition, a configuration bitstream is transmitted from either the TDI terminal of JTAG circuit 930, or from dual-purpose I/O pins 928 to configuration circuit 922. During a configuration operation, circuit 922 routes configuration data from the bitstream to memory array 925 to establish an operating state of FPGA 900. In addition, the configuration data may be used to enter initial data stored, for example, in memory arrays of selected logic circuits provided in logic plane 950 (discussed below).

Programmable logic plane 950 includes various programmable logic circuits and programmable interconnect resources that are configured by the configuration data entered through configuration plane 920. The programmable logic circuits of FPGA 900 include CLBs arranged in rows and columns, IOBs surrounding the CLBS, and one or more BlockSelectRAM+™ (Block RAM) circuits. The programmable interconnect resources include interconnect lines 952 (indicated by heavy black lines) and multi-way switch boxes 953 (indicated by rectangles) that are connected between the rows and columns of CLBs, IOBs, and Block RAM circuits 960. During normal operation of FPGA 900, logic signals are transmitted from dual-purpose pins 928 and/or device I/O pins 955 through the IOBs to the interconnect resources, which route these signals to the CLBs and Block RAMs 960 in accordance with the configuration data stored in memory array 925. The CLBs perform logic operations on these signals in accordance with the configuration data stored in memory array 925, and transmit the results of these logic operations to dual-purpose pins 928 and/or device I/O pins 955. Similarly, each Block RAM circuit 960 stores data that is used by the CLBs, and is selectively accessed through the IOBs and interconnect resources. Other programmable logic plane resources, such as clock resources, are omitted from FIG. 9 for brevity.

Figure 10:
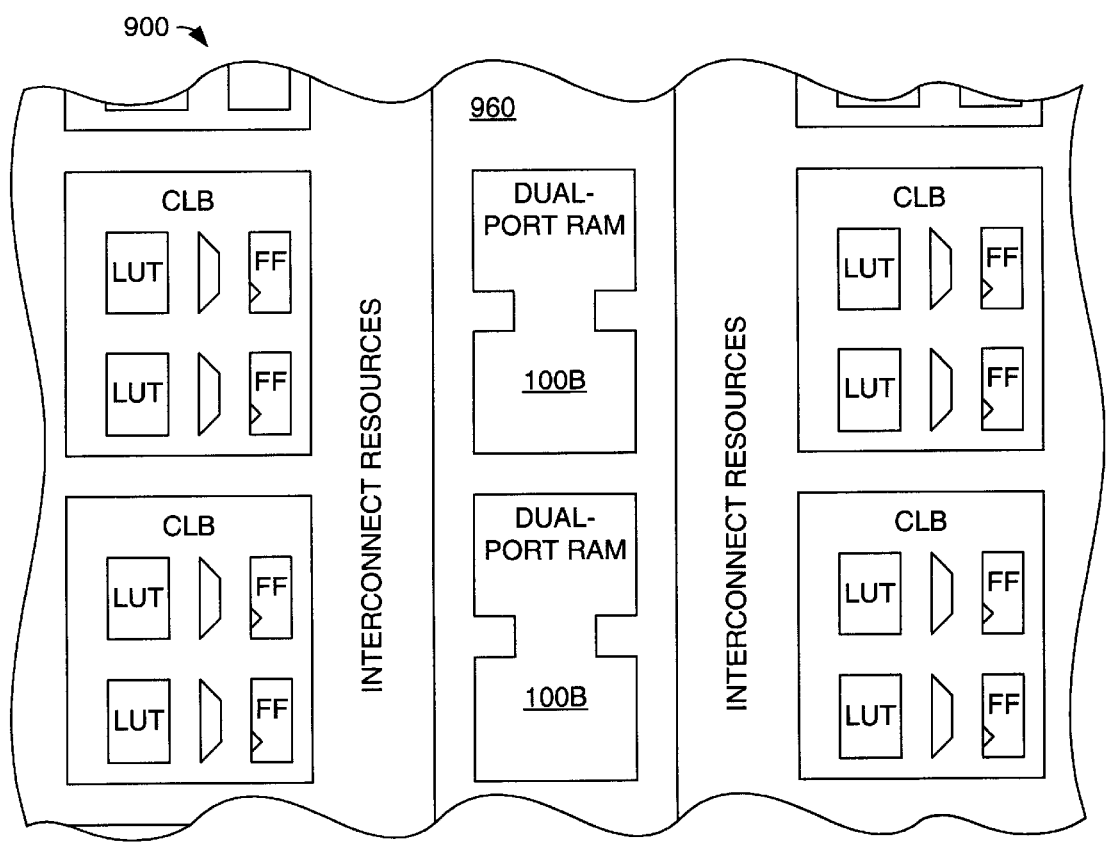
FIG. 10 is a block diagram showing a portion of the logic circuitry of the FPGA shown in FIG. 9.

FIG. 10 is a block diagram showing a portion of FPGA 900 that includes a section of block RAM 960 and adjacent interconnect resources and CLBs. Each block RAM 960 includes multiple 4K-bit True Dual-Port™ RAM circuits 100B that are connected to receive signals from and transmit signals onto the programmable interconnect resources of FPGA 900. In one embodiment, each 4K-bit dual-port RAM 100B includes a 16-by-256 memory cell array that can be used to implement a 16-word deep by 8-bit wide CAM function using the methods described herein. Specifically, each dual-port RAM 100B stores up to 16 decoded "one hot" data words, with each decoded "one hot" data word having one of 256 (i.e., $2^8$) possible decimal values. In accordance with the second main aspect of the present invention, a first port of dual-port RAM 100B is configured to address the memory array of dual-port RAM 100B as a 4096-word by 1-bit array of memory cells. Similarly, a second port of dual-port RAM 100B is configured to address the memory array as a 256-word×16-bit array of memory cells.

FIG. 10 also indicates that each CLB of FPGA 900 includes one or more look-up tables (LUTs) and flip-flops (FF) that are configurable for implementing a user's logic function. (For example, a Virtex CLB includes four LUTS and four flip-flops.) As discussed in the following embodiments, these logic circuits are utilized in combination with 4K-bit dual-port RAMs 100B to implement CAM functions.

The programming process used to generate the configuration data stored in configuration plane 920 of FPGA 900 typically utilizes design entry software (e.g., synthesis or schematic tools), place-and-route software, and bitstream generation software that are executed on a PC or workstation. The FPGA programming process typically begins when a user enters a logic function or circuit to be implemented using the CAD software. The CAD software often includes a library of pre-defined circuit "macros" that are typically provided by the PLD manufacturer to simplify the construction of a logic function. The use of "macros" (e.g., counters) in PLD programming processes is well known. After entering the logic function, the user then instructs the place-and-route software to generate configuration data that is converted into a bitstream by the bitstream generation software. Subsequently, when the bitstream is entered into FPGA 900, the configuration data configures FPGA 900 to implement the logic function.

In the following sections, the implementation of the present invention in PLDs is described primarily in the context of configured PLDs, such as FPGA 900 (FIG. 9), and the context of methods for operating such configured PLDs. However, the present invention is also directed to "macros" that are used to configure the PLD and facilitate the PLD operation described below.

Figure 11:
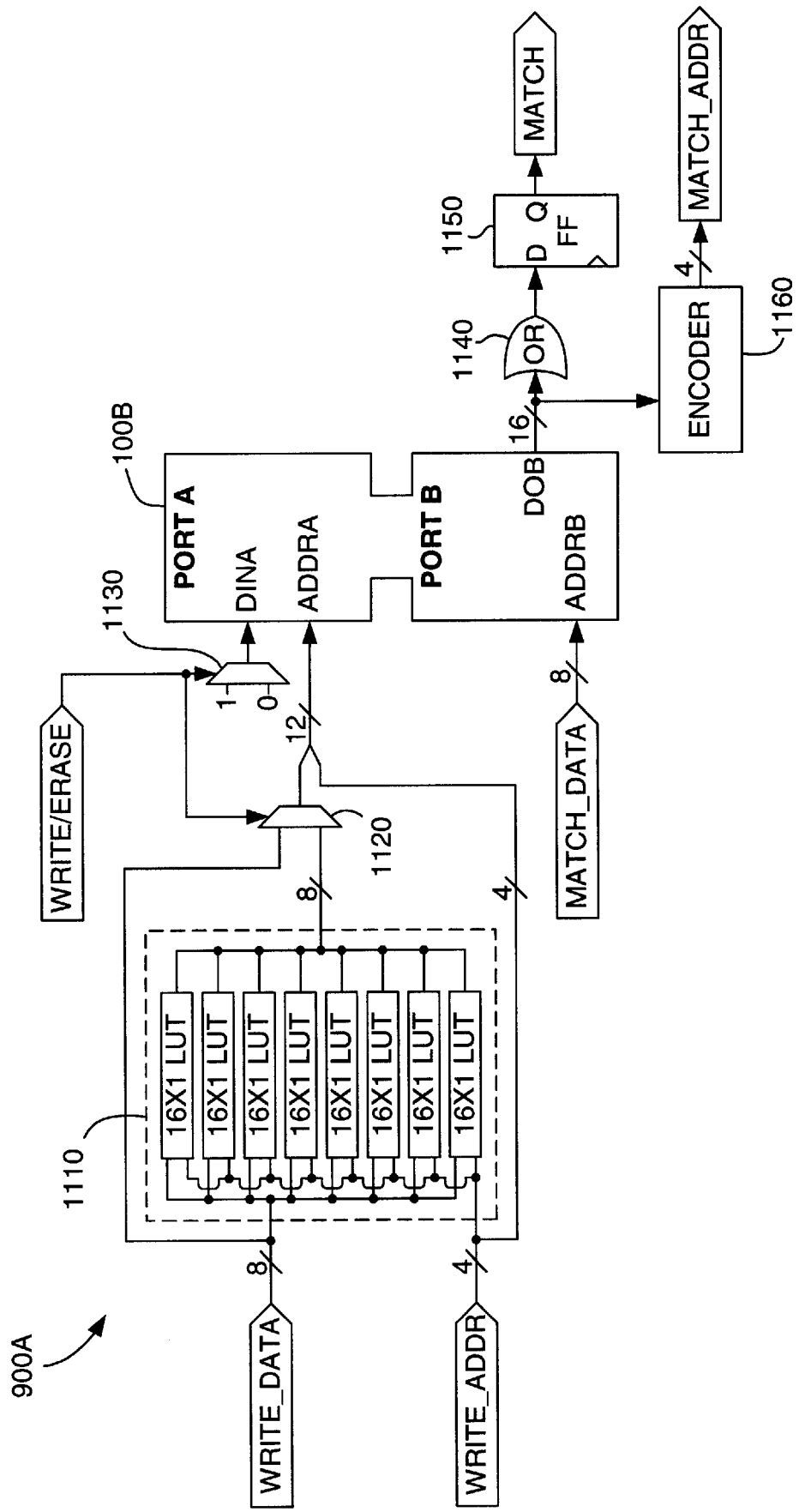
FIG. 11 is a block diagram showing logic and interconnect resources of a PLD that are configured to implement CAM functions in accordance with a first example.

FIG. 11 is a block diagram showing selected logic resources and interconnect resources of an FPGA 900A that are configured to implement CAM functions in accordance with a first example. Although the logic and interconnect resources of FPGA 900A are illustrated as specific logic elements and signal paths, FPGA 900A is physically identical to FPGA 900 (see FIG. 9).

In addition to a 4K-bit dual-port RAM 100B, the configured logic resources utilized in FPGA 900A include an encoded data memory 1110, a write data multiplexer 1120, a write/erase multiplexer 1130, a match detector (OR gate) 1140, a match register (flip-flop) 1150, and an optional encoder 1160. In one embodiment, encoded data memory 1110 is implemented using eight 16-by-1 LUTs that are provided in the CLBs of FPGA 900A. In another embodiment, encoded data memory 1110 is implemented by another dual-port RAM (not shown) of FPGA 900A. The remaining logic elements shown in FIG. 11 are implemented by various logic resources provided in the CLBs of FPGA 900A in accordance with known techniques.

The interconnect resources of FPGA 900A are configured using known techniques to provide the various signal paths shown in FIG. 11. A first set of interconnect resources forms eight signal paths that transmit an 8-bit WRITE_DATA word to data input terminals of encoded data memory 1110, and to a first set of input terminals of write data multiplexer 1120. A second set of interconnect resources forms eight signal paths that connect data output terminals of encoded data memory 1110 to a second set of input terminals of write data multiplexer 1120. A third set of interconnect resources forms eight signal paths that are connected to the output terminals of write data multiplexer 1120. A fourth set of interconnect resources forms four signal paths that transmit a 4-bit WRITE_ADDR word to address terminals of encoded data memory 1110, and are combined with the third set of interconnect resources to provide twelve address signals to the ADDRA terminals of PORT A of dual-port RAM 100B. A fifth set of interconnect resources forms a signal path that transmits the WRITE/ERASE signal to the select terminals of write data multiplexer 1120 and write/erase multiplexer 1130. The output terminal of write/erase multiplexer 1130 is connected by a sixth set of interconnect resources to the data input (DINA) terminal of PORT A. A seventh set of interconnect resources forms eight signal paths that transmit an 8-bit MATCH_DATA word to the ADDRB terminals of PORT B of dual-port RAM 100B. An eighth set of interconnect resources forms eight signal paths that transmit a 16-bit output word from the data output (DOB) terminal of PORT B to match detector 1140 and to encoder 1160. Interconnect resources are also used to connect the output terminal of match detector 1140 to the data input (D) terminal of match register 1150, and to transmit a MATCH signal generated by match detector 1150. A final set of interconnect resources forms four signal paths that transmit a 4-bit encoded MATCH_ADDR word from associated output terminals of encoder 1160.

FPGA 900A operates as follows. During write operations, a logic "1" WRITE/ERASE signal controls data write multiplexer 1120 and write/erase multiplexer 1130 to pass data signals received at first (e.g., upper) terminals to PORT A. Accordingly, a logic "1" bit value is transmitted to the data input (DINA) terminal of PORT A, and encoded WRITE_DATA and WRITE_ADDR words are transmitted to the ADDRA terminals of PORT A, thereby writing decoded "one hot" data words into the memory array of dual-port RAM 100B in accordance with the methods described above. In addition, the encoded WRITE_DATA and WRITE_ADDR words are transmitted to encoded data memory 1110. During each write operation, the applied WRITE_ADDR word is decoded to select one memory cell in each of the eight 16-by-1 LUTs, thereby causing these memory cells to store the applied encoded WRITE_DATA word. Accordingly, all sixteen decoded "one hot" data words stored in the memory array 100B are stored in an encoded form in encoded data memory 1110.

During data match operations, 8-bit MATCH_DATA words are transmitted to the ADDRB terminal of PORT B, thereby reading a selected row of memory cells from the memory array of dual-port RAM 100B in the manner described above. The data values stored in the selected row are transmitted to match detector 1140, which in one embodiment is a 16-bit OR gate. If any of the data bits in the 16-bit output word have a logic "1" value, then match detector 1140 generates a high (logic "1") output signal that is registered in match register 1150. Further, optional encoder 1160 may be used to identify the address of the matching decoded "one hot" data word stored in the memory array using known techniques.

During erase operations, the encoded data words stored in encoded data memory 1110 are used to erase the decoded "one hot" data words from the memory array of dual-port RAM 100B as follows. First, a logic "0" WRITE/ERASE signal controls data write multiplexer 1120 and write/erase multiplexer 1130 to pass data signals received at second (e.g., lower) terminals to PORT A. Accordingly, a logic "0" bit value is transmitted to the data input (DINA) terminal of PORT A from write/erase multiplexer 1130, and encoded data words are transmitted to the ADDRA terminals of PORT A from encoded data memory 1110. These encoded data words are read from encoded data memory 1110 in response to the 4-bit WRITE_ADDR signals, which are also transmitted to the ADDRA terminals of PORT A. Therefore, by storing the encoded data words in accordance with the present example, each decoded "one hot" data word is erased during one clock cycle using only the encoded WRITE_ADDR signal associated with that decoded "one hot" data word.

Figure 12:
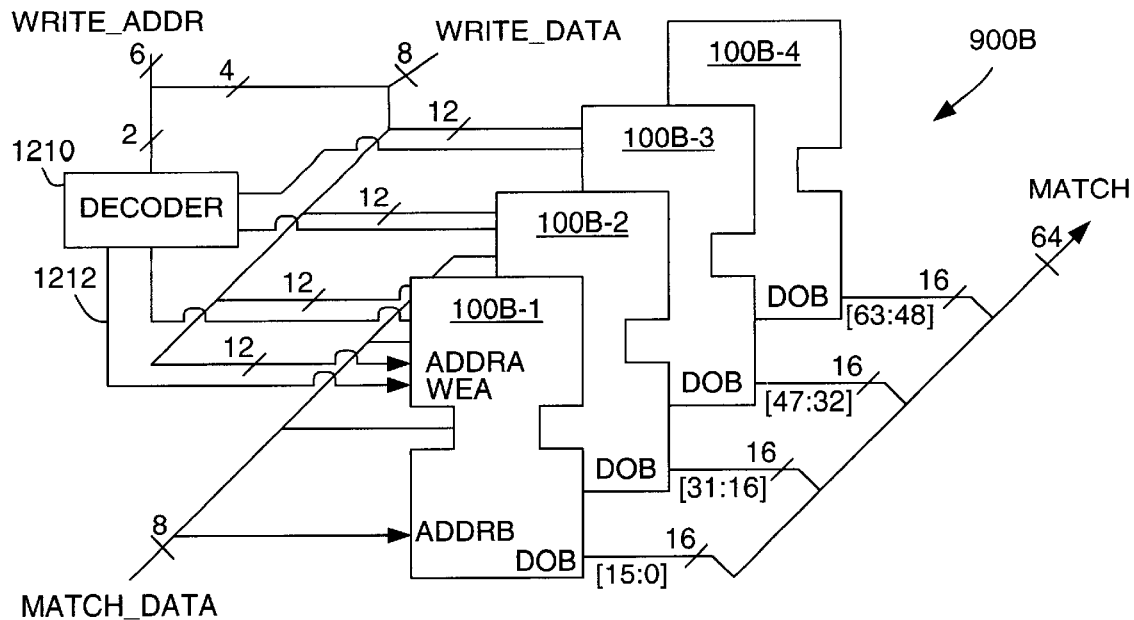
FIG. 12 is a block diagram showing logic and interconnect resources of a PLD that are configured to implement CAM functions in accordance with a second example.

FIG. 12 is another example showing selected logic resources and interconnect resources of an FPGA 900B that illustrate the expandable depth of CAM functions implemented in accordance with the present invention. Although only selected configured resources are shown in FIG. 12, FPGA 900B includes logic and interconnect resources that are identical to FPGA 900 (see FIG. 9).

Referring to FIG. 12, the configured logic resources utilized in FPGA 900B include four 4K-bit dual-port RAMS (referenced as 100B-1, 100B-2, 100B-3, and 100B-4) and a decoder 1210. Additional logic resources (not shown) may be included to perform one or more of the functions described above with reference to FPGA 900A (see FIG. 11). In one embodiment, encoder 1210 is implemented by various logic resources provided in the CLBs of FPGA 900B in accordance with known techniques.

The interconnect resources of FPGA 900B provide the signal paths shown in FIG. 12. Specifically, a 6-bit WRITE_ADDR word is separated into a 2-bit portion that is transmitted to decoder 1210, and a 4-bit portion that is combined with the 8-bit WRITE_DATA word and transmitted to the ADDRA terminals of each dual-port RAM 100B-1 through 100B-4. During write and erase operations, the 2-bit portion of the WRITE_ADDR word is decoded by decoder 1210, which selects (enables) one of dual-port RAMs 100B-1 through 100B-4 using a write enable signal. For example, in response to a predetermined 2-bit portion of the WRITE_ADDR word, decoder 1210 transmits a write enable signal on signal path 1212 to the PORT A write enable (WEA) terminal of dual-port RAM 100B-1, thereby enabling dual-port RAM 100B-1 to store a logic "1" (or logic "0") bit value in the memory cell addressed by the 12-bit word received at its PORT A address (ADDRA) terminal. During data match operations, each 8-bit MATCH_DATA word is simultaneously applied to all four dual-port RAMs 100B-1 through 100B-4, thereby comparing the MATCH_DATA word to the sixteen decoded "one hot" data words stored in each of the dual-port RAMs 100B-1 through 100B-4. The resulting 16-bit output words transmitted from the PORT B data output (DOB) terminal of each dual-port RAM 100B-1 through 100B-4 during a data match operation are provided as a 64-bit output word. Accordingly, FPGA 900B performs a CAM function in which 64 decoded "one hot" data words are compared simultaneously to the MATCH_DATA word, and each of the 64 decoded "one hot" data words is individually addressed in the 64-bit output word.

The example shown in FIG. 12 illustrates the flexibility of the present invention in that the depth of an implemented CAM function is expandable by combining two or more dual-port RAMs 100B. As used herein, the term "depth" refers to the number of data words that can be searched during a single data match operation (i.e., during a single clock cycle) such that the decoded address of the stored data words is included in the output word. Because each dual-port RAM 100B-1 through 100B-4 generates a decoded 16bit address (similar to a 16-bit decoded "one-hot" data word), the depth of the CAM function implemented on a PLD in accordance with the present invention is only limited by the number of dual-port RAMs 100B that are provided on the PLD. In contrast, PLDs that include dedicated CAM circuits are limited by the output structure of the CAM circuit. For example, the dedicated CAM circuit provided in APEX 20KE devices (discussed above) is designed with 16 output terminals, thereby limiting the depth of CAM functions performed in each dedicated CAM circuit to sixteen of the thirty-two data words (a second clock cycle is needed to match the remaining sixteen words stored in the dedicated CAM circuit). Therefore, the methods of the present invention efficiently support a wide range of CAM functions implemented by a PLD without requiring dedicated CAM circuitry that takes up valuable die space when a user's logic function does not implement CAM functions.

Figure 13:
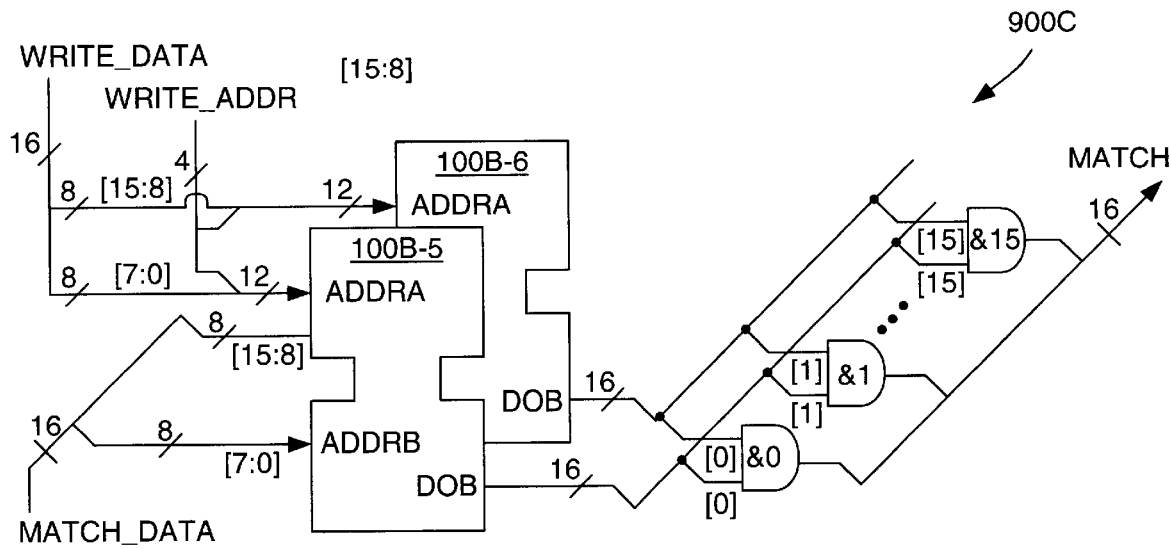
FIG. 13 is a block diagram showing logic and interconnect resources of a PLD that are configured to implement CAM functions in accordance with a third example.

FIG. 13 is a block diagram showing yet another example of an FPGA 900C whose logic resources and interconnect resources are configured to illustrate the expandable width of CAM functions implemented in accordance with the present invention. Although only selected configured resources are shown in FIG. 13, FPGA 900C includes logic and interconnect resources that are identical to FPGA 900 (see FIG. 9).

Referring to FIG. 13, the configured logic resources utilized in FPGA 900C include two 4K-bit dual-port RAMs (referenced as 100B-5 and 100B-6) and fifteen two-input AND gates &0 through &15. Additional logic resources (not shown) may be included to perform one or more of the functions described above with reference to FPGA 900A (see FIG. 11). In one embodiment, AND gates &0 through &15 are implemented in the LUTs of FPGA 900B in accordance with known techniques.

FPGA 900C operates as follows. During write and erase operations, a 16-bit WRITE_DATA word is separated into two 8-bit portions that are respectively combined with the 4-bit WRITE_ADDR word and transmitted to the PORT A address (ADDRA) terminals of dual-port RAMs 100B-5 and 100B-6. In particular, bits 0 through 7 of the 16-bit WRITE_DATA word are transmitted to dual-port RAM 100B-5, and bits 8 through 15 of the 16-bit WRITE_DATA word are transmitted to dual-port RAM 100B-6. During data match operations, 16-bit MATCH_DATA words are similarly separated into two portions that are respectively transmitted to the PORT B address (ADDRB) terminals of dual-port RAMs 100B-5 and 100B-6. The sixteen bits of the output words transmitted from the PORT B data output (DOB) terminal of each dual-port RAM 100B-5 and 100B-6 are ANDed together by AND gates &0 through &15 to form a 16-bit decoded address. Specifically, bit 0 of each 16-bit output word is ANDed by AND gate &0, bit 1 of each 16-bit output word is ANDed by AND gate &1 . . . , and bit 15 of each 16-bit output word is ANDed by AND gate &15. A match is determined only if both corresponding output bits have logic "1" bit values, and the resulting high output signal from the corresponding two-input AND gate provides the decoded address of the matching decoded "one hot" data word.

The example shown in FIG. 13 illustrates yet another flexible feature of the present invention in that the width of an implemented CAM function is expandable by combining two or more dual-port RAMs in a manner similar to that illustrated by FPGA 900C. For example, 32-bit data words can be stored and compared using four dual-port RAMs and sixteen four-input AND gates. In contrast, PLDs that include dedicated CAM circuits are limited to the particular capacity provided by the PLD manufacturer. For example, the dedicated CAM circuit provided in APEX 20KE devices (discussed above) is limited to 32-bit data words when single clock cycle CAM operations are required. Therefore, the methods of the present invention support a wide range of CAM functions implemented by a PLD without requiring dedicated CAM circuitry that takes up valuable die space when a user's logic function does not implement CAM functions.

The above examples illustrate various implementations using the CAM function implementation methods of the present invention. Those having skill in the relevant arts of the invention will now perceive various modifications and additions that may be made as a result of the disclosure herein. Accordingly, all such modifications and additions are deemed to be within the scope of the invention, which is to be limited only by the appended claims and their equivalents.

What s claimed is:

1. A method for implementing a content addressable memory function using a dual-port random-access memory (RAM) circuit, the dual-port RAM including an array of memory cells arranged in a plurality of columns and a plurality of rows, the method comprising:

storing a plurality of decoded "one hot" data words in the array of memory cells such that each decoded "one hot" data word is stored in an associated column of said memory cells;

performing a data match operation by reading a selected row of the plurality of rows in response to an applied match data value, wherein each memory cell of the selected row contains a data bit value from one of the plurality of "one hot" data words; and generating a match signal if any of the bit values stored in the selected row includes a logic "1" bit value.

2. The method according to claim 1, wherein the dual-port RAM further includes a first input port and a second input port, and wherein the step of storing the plurality of "one hot" data words further comprises:

receiving an X+Y-bit word at an address terminal of the first input port, wherein the X+Y-bit word includes an X-bit write data portion and a Y-bit write address portion;

decoding the Y-bit write address portion to access a corresponding column of the array of memory cells;

decoding the X-bit write data portion to access a corresponding row of the array of memory cells; and writing a logic "1" bit value into a memory cell located in the corresponding row and corresponding column of the array of memory cells.

3. The method according to claim 2, wherein the step of writing comprises receiving the logic "1" bit value at a data input terminal of the first input port.

4. The method according to claim 2, wherein the step of performing a data match operation comprises:

receiving an X-bit match data word at an address terminal of the second input port;

decoding the X-bit match data word to access the selected row of the array of memory cells; and transmitting data bit values from each memory cell of the selected row of memory cells to an output port of the dual-port RAM.

5. The method according to claim 2, wherein, after the step of generating a match signal, the method further comprises:

receiving the X+Y-bit word at the address terminal of the first input port;

decoding the Y-bit write address portion to access the corresponding column of the array of memory cells;

decoding the X-bit write data portion to access the corresponding row of the array of memory cells; and erasing the memory cell located in the corresponding row and corresponding column by writing a logic "0" into the memory cell.

6. The method according to claim 5, wherein the step of erasing comprises receiving the logic "0" bit value at a data input terminal of the first input port.

7. A method for configuring a dual-port random-access memory (RAM) circuit to implement a content addressable memory (CAM) function, the dual-port RAM including an array of memory cells arranged in columns and rows, a first configurable input port, a second configurable input port, and a configurable output port, the method comprising:

configuring the first configurable input port to address a selected memory cell of the plurality of memory cells in response to an X+Y-bit word, wherein the selected memory cell is located in a first selected row and selected column of the array of memory cells, wherein an X-bit portion of the X+Y-bit word addresses the first selected row, and wherein a Y-bit portion of the X+Y-bit word addresses the selected column;

configuring the second configurable input port to read $2^Y$ data bit values from memory cells located in a second selected row of the plurality of rows in response to an X-bit data match word; and configuring the configurable output port to generate the $2^Y$ data bit values read from the second selected row of memory cells.

8. The method according to claim 7, further comprising initializing the array of memory cells such that each of the memory cells stores a logic "0" bit value.

9. The method according to claim 7, further comprising initializing the array of memory cells such that each column of memory cells stores a decoded "one hot" data word.

10. The method according to claim 7, further comprising storing a plurality of decoded "one hot" data words in the array of memory cells such that each decoded "one hot" data word is stored in an associated column of said memory cells.

11. The method according to claim 10, wherein the step of storing the plurality of "one hot" data words further comprises:
   receiving the X+Y-bit word at an address terminal of the first configurable input port;
   decoding the Y-bit write address portion to access a corresponding column of the array of memory cells;
   decoding the X-bit write data portion to access a corresponding row of the array of memory cells; and
   writing a logic "1" bit value into a memory cell located in the corresponding row and corresponding column of the array of memory cells.

12. The method according to claim 11, wherein the step of writing comprises receiving the logic "1" bit value at a data input terminal of the first configurable input port.

13. The method according to claim 10, further comprising:
   performing a data match operation by reading the second selected row of the plurality of rows in response to an applied match data value, wherein each memory cell of the second selected row contains a data bit value from one of the plurality of "one hot" data words; and
   generating a match signal if any of the bit values stored in the selected row includes a logic "1" bit value.

14. The method according to claim 13, wherein the step of performing a data match operation further comprises:
   receiving an X-bit match data word at an address terminal of the second configurable input port;
   decoding the X-bit match data word to access the second selected row of the array of memory cells; and
   transmitting data bit values from each memory cell of the second selected row of memory cells to the configurable output terminal of the dual-port RAM.

15. The method according to claim 13, wherein, after the step of generating a match signal, the method further comprises:
   receiving the X+Y-bit word at the address terminal of the first configurable input port;
   decoding the Y-bit portion to access the corresponding column of the array of memory cells;
   decoding the X-bit portion to access the corresponding row of the array of memory cells; and
   erasing the memory cell located in the corresponding row and corresponding column by writing a logic "0" into the memory cell.

16. The method according to claim 15, wherein the step of erasing comprises receiving the logic "0" bit value at a data input terminal of the first configurable input port.

17. A method for operating a programmable logic device (PLD) to implement a content addressable memory (CAM) function, the PLD including:
   a dual-port random-access memory (RAM) circuit having an array of memory cells arranged in columns and rows, a first configurable input port, a second configurable input port, and a configurable output port,
   a plurality of configurable logic blocks (CLBs), and
   programmable interconnect resources connected between the dual-port RAM and the plurality of CLBs,
   wherein the method comprises:
      initializing all of the memory cells in the array of memory cells to logic "0";
      accessing a selected memory cell by applying an X+Y-bit word to an address terminal of the first input port, wherein the selected memory cell is located in a selected row and selected column of the array of memory cells, wherein an X-bit portion of the X+Y-bit word addresses the selected row, and wherein a Y-bit portion of the X+Y-bit word addresses the selected column;
      writing a logic "1" bit value to the selected memory cell by applying the logic "1" bit value to a data input terminal of the first port; and
      performing a data match operation by applying an X-bit word to an address terminal of the second input port, wherein the X-bit word addresses a row of the memory cells, whereby data bit values stored in the row of memory cells are transmitted to the output port.

18. A method for configuring a programmable logic device (PLD) to implement a content addressable memory (CAM) function, the PLD including:
   a dual-port random-access memory (RAM) circuit having an array of memory cells arranged in columns and rows, a first configurable input port, a second configurable input port, and a configurable output port,
   a plurality of configurable logic blocks (CLBs), and
   programmable interconnect resources connected between the dual-port RAM and the plurality of CLBs,
   wherein the method comprises:
      configuring the first programmable input port to address a selected memory cell of the plurality of memory cells in response to an X+Y-bit word, wherein the selected memory cell is located in a first selected row and selected column of the array of memory cells, wherein an X-bit portion of the X+Y-bit word addresses the first selected row, and wherein a Y-bit portion of the X+Y-bit word addresses the selected column;
      configuring the second programmable input port to read $2^Y$ data bit values from memory cells located in a second selected row of the plurality of rows in response to an X-bit data match word; and
      configuring the output port to generate the $2^Y$ data bit values read from the second selected row of memory cells.

19. A programmable logic device (PLD) that is configured to implement a content addressable memory (CAM) function, the PLD comprising a dual-port random-access memory (RAM) circuit having an array of memory cells arranged in columns and rows, a first configurable input port, a second configurable input port, and a configurable output port,
   wherein the first programmable input port is configured to address a selected memory cell of the plurality of memory cells in response to an X+Y-bit word, the selected memory cell being located in a first selected row and selected column of the array of memory cells, wherein an X-bit portion of the X+Y-bit word addresses the selected row, and wherein a Y-bit portion of the X+Y-bit word addresses the first selected column,
   wherein the second programmable input port is configured to read $2^Y$ data bit values from memory cells located in a second selected row of the plurality of rows in response to an X-bit data match word, and
   wherein the output port is configured to generate the $2^Y$ data bit values read from the second selected row of memory cells.

20. A macro for configuring a programmable logic He (PLD) to implement a content addressable memory (CAM) function, the PLD comprising a dual-port random-access memory (RAM) circuit having an array of memory cells arranged in columns and rows, a first configurable input port, a second configurable input port, and a configurable output port, wherein the macro comprises:

means for configuring the first input port to address a selected memory cell of the plurality of memory cells in response to an X+Y-bit word, the selected memory cell being located in a first selected row and selected column of the array of memory cells, wherein an X-bit portion of the X+Y-bit word addresses the first selected row, and wherein a Y-bit portion of the X+Y-bit word addresses the selected column, means for configuring the second input port to read $2^Y$ data bit values from memory cells located in a second selected row of the plurality of rows in response to an X-bit data match word, and means for configuring the output port to generate the $2^Y$ data bit values read from the second selected row of memory cells.

* * * * *